United States Patent [19]

Kato et al.

[11] Patent Number: 5,096,882
[45] Date of Patent: Mar. 17, 1992

[54] PROCESS FOR CONTROLLING OXYGEN CONTENT OF SUPERCONDUCTIVE OXIDE, SUPERCONDUCTIVE DEVICE AND PROCESS FOR PRODUCTION THEREOF

[75] Inventors: Takahiko Kato, Hitachi; Katsuzo Aihara, Hitachiota; Jiro Kuniya, Hitachi; Yutaka Misawa, Katsuta; Yoshihide Wadayama, Sendai; Masahiro Ogihara, Katsuta; Toshikazu Nishino, Kawasaki; Ushio Kawabe, Tokyo; Haruhiro Hasegawa, Kokubunji; Kazumasa Takagi, Tokyo; Tokuumi Fukazawa, Tachikawa; Katsuki Miyauchi, Hino, all of Japan

[73] Assignee: Hitachi, Ltd., Tokyo, Japan

[21] Appl. No.: 178,905

[22] Filed: Apr. 7, 1988

[30] Foreign Application Priority Data

| Apr. 8, 1987 | [JP] | Japan | 62-84770 |
| Apr. 15, 1987 | [JP] | Japan | 62-90762 |
| Apr. 17, 1987 | [JP] | Japan | 62-93025 |
| Apr. 30, 1987 | [JP] | Japan | 62-104283 |

[51] Int. Cl.$^5$ .................. H01B 12/00; C01B 13/00; C01D 1/00
[52] U.S. Cl. .................. 505/1; 505/725; 505/730; 427/35; 427/38; 427/43.1; 427/61; 427/62; 204/157.41; 204/157.44; 204/157.5; 204/157.51
[58] Field of Search .................. 204/157.41, 157.44, 204/157.5, 157.51; 505/730, 731, 725, 1; 427/35, 38, 36, 43.1, 53.1, 55, 62, 63

[56] References Cited

U.S. PATENT DOCUMENTS

| 4,664,933 | 5/1987 | Tachikawa | 427/12 |
| 4,843,060 | 6/1989 | Lessoff et al. | 505/1 |
| 4,952,556 | 8/1990 | Mantese et al. | 505/1 |

FOREIGN PATENT DOCUMENTS

| 631707 | 11/1961 | Canada | 204/157.44 |
| 61-168530 | 7/1986 | Japan . | |
| 63-263482 | 10/1988 | Japan . | |
| 752243 | 7/1956 | United Kingdom | 204/157.44 |

OTHER PUBLICATIONS

*Extended Abstracts,* (48th Autumn Meeting 1987), Japan Society of Applied Physics, No. 1, pp. 83–84, Oct. 17, 1987.
Koch et al., *Proceedings of Symposium S,* 1987, Spring Meeting of the MRS, pp. 81–83, Apr. 23, 1987.
Sekula et al., *Proc. 18th Int. Conf. on Low Temp. Physics,* Kyoto, 1987/Japanese Journal of Applied Physics, vol. 26, Supp. 26-3, 8–20, 1987.
Umezawa et al., *Physical Review B,* vol. 36, pp. 7151–7154.
Murakami et al., *Japanese Journal on Applied Physics,* vol. 26, No. 10, Oct. 1987, pp. L1731–L1735.
Studer et al., *Materials Research Society Symposium Proceedings,* vol. 99, Symposium held Nov. 30–Dec. 4, 1987.
Kato et al., *Japanese Journal of Applied Physics,* vol. 27, No. 11, Nov. 1988, pp. L2097–L2099.

(List continued on next page.)

*Primary Examiner*—John F. Niebling
*Assistant Examiner*—Steven P. Marquis
*Attorney, Agent, or Firm*—Antonelli, Terry, Stout & Kraus

[57] ABSTRACT

A process for controlling an oxygen content of a non-superconductive or superconductive oxide is provided, in which a beam of particles such as ions, electrons or neutrons or an electromagnetic radiation is applied to the non-superconductive or superconductive oxide of a perovskite type such as $YBa_2Cu_3O_{7-x}$, thereby increasing or reducing the oxygen content of the oxide at the sites of oxygen in the crystal lattice of the oxide. Furthermore, a superconductive device such as a superconductive magnet, superconductive power transmission wire, superconductive transformer, superconductive shield, permanent current switch and electronic element is made by utilizing the process for controlling the oxygen concentration of the superconductive oxide.

43 Claims, 21 Drawing Sheets

OTHER PUBLICATIONS

Chu et al., *Physical Review Letters*, vol. 58, No. 4, pp. 405–407, Jan. 26, 1987.

Cava et al., *Physical Review Letters*, vol. 58, No. 4, pp. 408–410, Jan. 26, 1987.

*Nihon Keizai Shimbun*, Science column published Mar. 3, 1987.

Geerk et al., *Z Phy. B-Condensed Matter*, vol. 67, pp. 507–511.

Dearnaley, G. et al., *Ion Implantation*, N.Y., North-Holland, 1973, pp. 154–163, TK 7871.85.D4.

Gamo, K. et al., "Control of Tc for Niobium by N Ion Implantation", *Japanese Journal of Applied Physics*, vol. 16, No. 10 (Oct. 1977), pp. 1853–1854.

Cava, R. J., "Bulk Superconductivity at 36K in $La_{1.8}Sr_{0.2}CuO_4$", *Physical Review Letters*, vol. 58, No. 4 (Jan. 26, 1987).

ENERGY DENSITY OF ELECTRON
BEAM, LASER LIGHT OR
INFRARED RAY

190

191

192

193

194

PROCESS FOR CONTROLLING OXYGEN CONTENT OF SUPERCONDUCTIVE OXIDE, SUPERCONDUCTIVE DEVICE AND PROCESS FOR PRODUCTION THEREOF

BACKGROUND OF THE INVENTION

1. Field of the Invention

This invention relates to a process for controlling the oxygen content of a perovskite oxide, layer perovskite oxide, oxygen-dificient layer perovskite oxide, multilayer perovskite oxide and spinel oxide, thereby providing a superconductive oxide having a critical temperature and/or critical current density, and further to a superconductive device and a process for producing the device.

2. Description of the Related Art

Hitherto, only three kinds of superconductive alloys such as $Nb_3Sn$ have used for practical applications and their critical temperature exhibiting the superconductivity was at most 23° K. for $Nb_3Ge$. Therefore, expensive helium must be used for cooling the superconductive alloys and cooling efficiency is low. For raising up the cooling efficiency, a material exhibiting superconductivity at a higher temperature has been required. Thus, many and intensive studies on various elements, alloys, compounds, ceramics or organic materials have recently been made. Among these materials, it has recently been discovered that perovskite oxides, particularly layer perovskite oxides have a very high critical temperature Tc. For example, the layer perovskide oxide of a La-Ba-Cu-O, La-Sr-Cu-O or Y-Ba-Cu-O type has a Tc of 30° K. or higher, particularly the Y-Ba-Cu-O type oxide has a Tc of 90° K. or higher. Therefore, cheaper liquid hydrogen, liquid neon or liquid nitrogen (one-tenth of the price of liquid helium) can not only be used as a coolant, but also allows their cooling efficiency to be raised up to 20 times that of liquid helium. These superconductive oxides are disclosed in, for example, Physical Review Letters, Vol. 58, No. 4, 1987, pp. 405–407 for the La-Ba-Cu-O type oxides, Physical Review Letters, Vol. 58, No. 4, 1987, pp. 408-410 for the La-Sr-Cu-O type oxides, and NIHON KEIZAI SHIMBUN, Science Column, Mar. 3, 1987 for the Y-Ba-Cu-O type oxides.

These oxides can be prepared from constituents of the oxides by a so-called sintering method. In this method, it is easy to control the proportions of the constituents other than oxygen but hard to control the proportion of oxygen. Particularly, the oxides sintered under the specified conditions of sintering temperature and sintering time alone have a different critical temperature Tc for each of sintered charges. Tc of sintered oxides varies depending upon oxygen partial pressures of sintering atmospheres, even if the oxides are fired at the same temperature for the same period of time. Such great differences in Tc are caused by differences in oxygen concentration between sintered charges. The oxygen concentration of sintered oxides cannot be controlled even by various post-heat treatments. Therefore, prior art has such a problem that high Tc cannot be obtained with good reproducibility. Accordingly, practical and reliable devices utilizing superconductive oxides have not yet been obtained with good reproducibility.

Under the circumstances, some processes for controlling the oxygen content of superconductive oxides have been proposed. Processes for controlling the oxygen content to raise up Tc are described in Z. Phy. B-Condensed Matter 67 (1987), p.507, and Extended Abstracts (The 48th Autumn Meeting, 1987), The Japan Society of Applied Physics, No. 1, p.83. In the former, it is shown that $O^+$ of 300 keV was applied at a dose of $5 \times 10^{16}$ $O^+/cm^2$ to a La-Sr-Cu-O oxides (a film prepared by RF magnetron sputtering) and then this oxide was annealed at 900° C. for 30 minutes, thereby raising up Tc by 4° K. In the latter, it is shown that $O^+$ of 0.5 keV was applied at 350° C. and $1.1 \times 10^{18}$ ions/cm² to a Y-Ba-Cu-O oxide (a film prepared by RF magnetron sputtering), whereby original $Tc_{offset}$ of 66° K. was raised up to 79° K. On the other hand, processes for controlling the oxygen content to reduce Tc are described in Extended Abstracts (The 48th Autumn Meeting, 1987), The Japan Society of Applied Physics, No. 1, p.84, in which it is shown that $H+$ of 1 keV was applied at 300° K. and $3.5 \times 10^{17}$ ions/cm² to a Y-Ba-Cu-O oxide (a film prepared by RF magnetron sputtering), thereby conspicuously reducing $Tc_{offset}$, which confirms the possibility of forming a weak joint in Josephson elements.

Furthermore, it is also disclosed that a non-superconductive oxide is obtained by applying particle beams or electromagnetic radiations to a superconductive oxide, and a superconductive device in which an applied non-superconductive oxide is formed in a superconductive oxide is also disclosed (see, for example, Proceedings of Symposium S, 1987, Spring Meeting of the MRS, p.81).

In Proceedings of Symposium S, 1987, Spring Meeting of the MRS, p.81, lithography and ion-planting were made by applying $O^+$ of 500 keV (0.3 to 3 MeV) at $6 \times 10^{13}$ ions/cm² up to $10^{15}$ /ions/cm² to a thin film of $YBa_2Cu_3O_y$ prepared by electron beam evaporation, to convert selected areas of the film to a non-superconductive oxide, thus preparing a dc SQUID (Superconducting Quantum Interference Device) which was confirmed to work at 68° K.

In Proc. 18th Int. Conf. on Low Temperature Physics Kyoto, 1987/Japanese Journal of Applied Physics, 26 (1987), Supplement 26-3, fast neutron was applied at $1.3 \times 10^{18}$ n/cm² (E>0.1 MeV) to $La_{1.85}Sr_{0.15}CuO_4$, wehreby Tc was reduced by 3° K. and Jc was raised up to 2 times of $1.2 \times 10^4$ A/cm² in a magnetic field of 4.2K and 2T.

In Physical Review B 36 (1987), pp. 7151–7154, fast neutron was applied up to $8.16 \times 10^{17}$ n/cm² to single crystals of $YBa_2Cu_3O_{7-\delta}$, which confirmed that Jc was raised up.

SUMMARY OF THE INVENTION

An object of this invention is to provide a process for precisely controlling the oxygen content of a perovskite oxide, layer perovskite oxide, oxygen-dificient layer perovskite oxide, multilayer perovskite oxide and spinel oxide at the site of crystal lattice, by applying particle beams or electromagnetic radiations to the oxide.

Another object of this invention is to provide a process for providing a semiconductive device with superconductive circuits or wirings without using any etching technique such as reactive ion etching technique.

A further object of this invention is to provide a process for producing a superconductive oxide having a high critical temperature Tc and/or high critical current density Jc.

Still further object of this invention is to provide a superconductive device such as a superconductive magnet, superconductive power transmission wire, superconductive transformer, superconductive shield, permanent current switch and electronic element.

In accordance with this invention, there is provided a process for controlling an oxygen content of a non-superconductive or superconductive oxide, comprising applying particle beams or electromagnetic radiations to the non-superconductive or superconductive oxide, thereby increasing or reducing the oxygen content of the oxide at sites of oxygen in the crystal lattice of said oxide.

In accordance with this invention, there is provided a superconductive device having a non-superconductive oxide layer formed on an electrically insulative substrate, said layer containing a superconductive oxide region formed therein by applying particle beams or electromagnetic radiations to the non-superconductive oxide layer at a predetermined region thereof.

In accordance with this invention, there is provided a superconductive device having a superconductive oxide layer formed on an electrically insulative substrate, said layer containing a non-superconductive oxide region formed therein by applying particle beams or electromagnetic radiations to the superconductive oxide layer at a predetermined region thereof.

DESCRIPTION OF THE PREFERRED EMBODIMENTS

Figure 1:
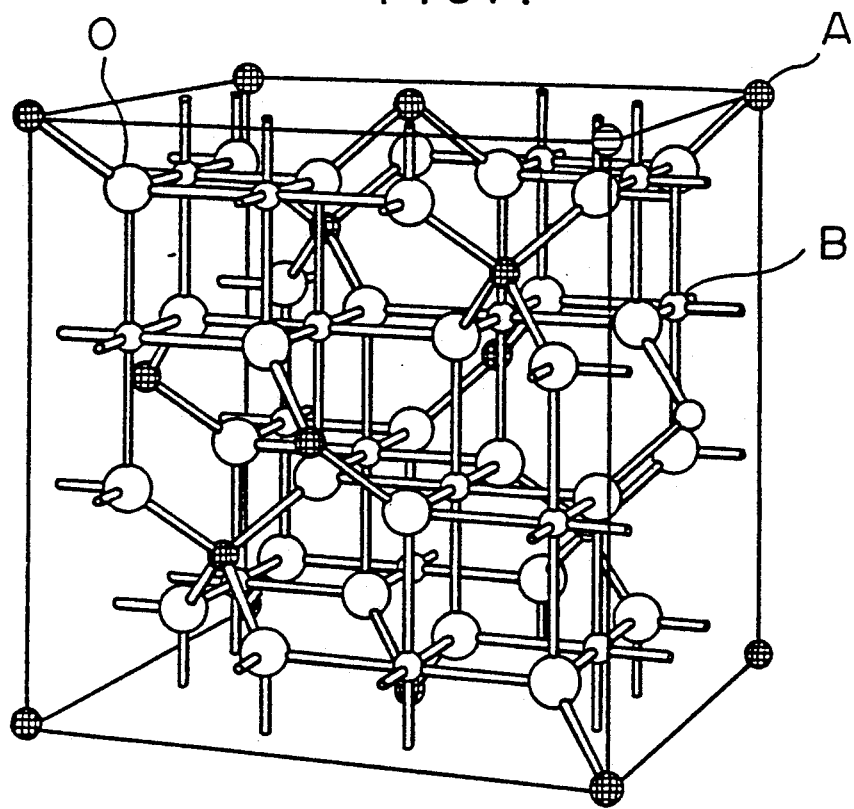
FIG. 1 shows a schematical view of a spinel crystal structure of $AB_2O_4$.
Figure 2:
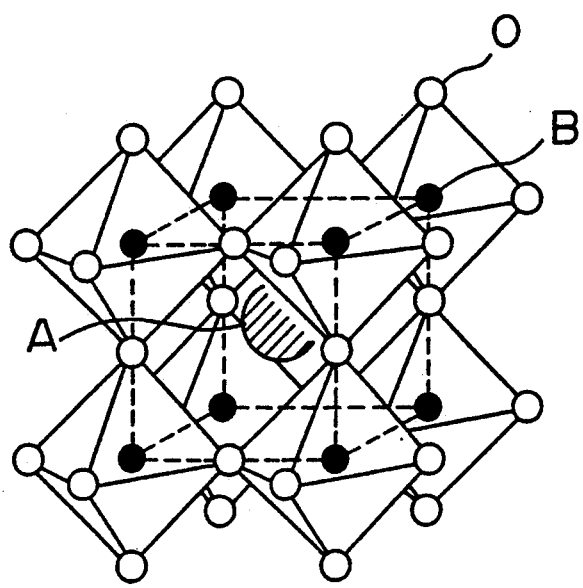
FIG. 2 shows a schematical view of a perovskite crystal structure of $ABO_3$.
Figure 3:
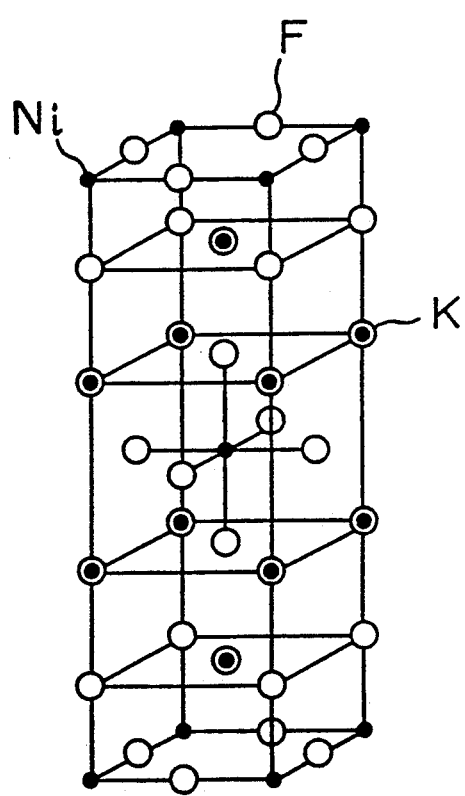
FIG. 3 shows a schematical view of a layer perovskite crystal structure of $K_2NiF_4$.
Figure 4:
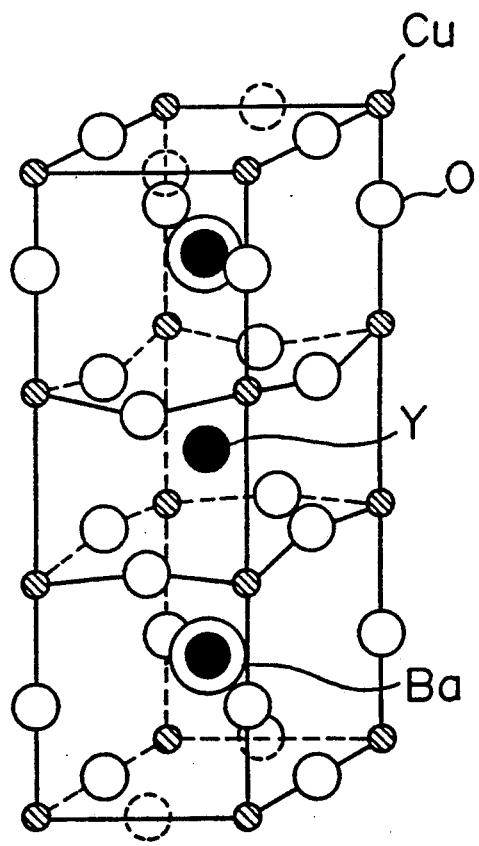
FIG. 4 shows a schematical view of an oxygen-dificient layer perovskite crystal structure of, for example, typically $YBa_2Cu_3O_7$.
Figure 5:
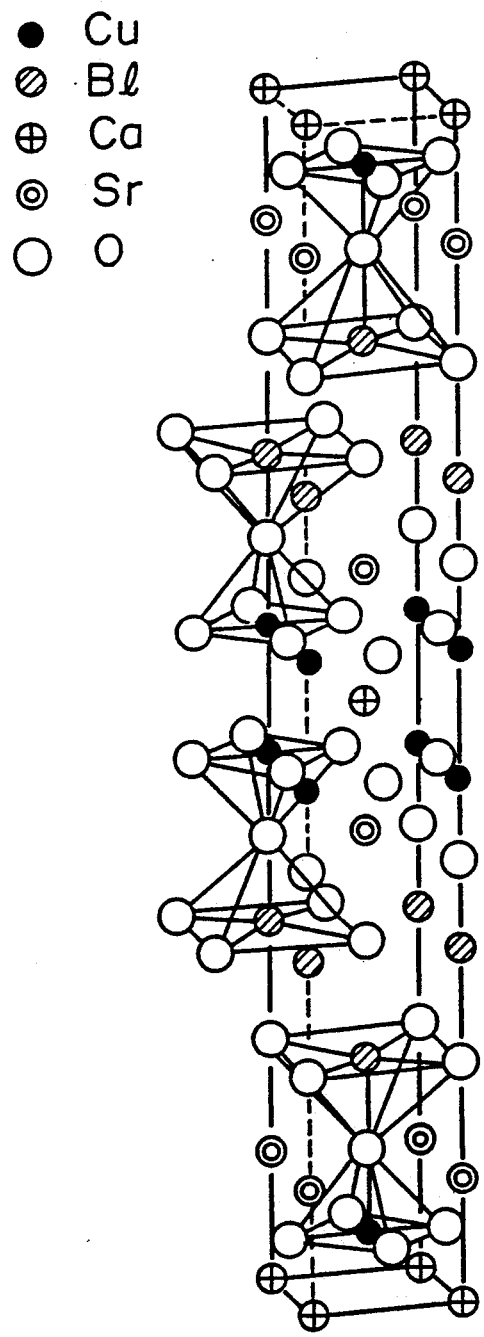
FIG. 5 shows a schematical view of a multilayer perovskite crystal structure of, for example, typically $Bi_4Sr_3Ca_3Cu_4O_{16}$.
Figure 6:
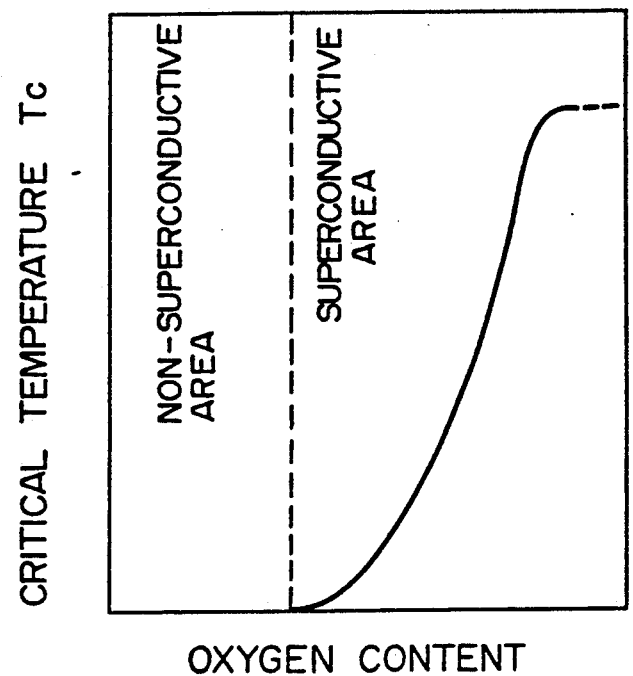
FIG. 6 is a graph showsing a relationship between the oxygen content of oxide and the critical temperature.

The oxides to be treated according to this invention may include perovskite oxides, layer perovskite oxides, oxygen-deficient layer perovskite oxides, multilayer perovskite oxides, spinel oxides and oxides having similar crystal structures. The spinel type oxides have a structure of $AB_2O_4$, wherein A is an alkali metal and B is a transition metal, and it is typically $LiTi_2O_4$, which is schematically shown in FIG. 1, in which A site is occupied by Li and B site occupied by Ti. FIG. 2 schematically shows a structure of the perovskite oxides of $ABO_3$, wherein A is Ba, Pb, La, Pr or Nd and B is Cu, Mg, Mn, Fe, Co or Ni, or $A_{1-x}A'_xBO_3$, wherein A' is Ca, Ba, Sr or Pb, such as $BaPb_{1-x}Bi_xO_3$, $BaPbO_3$, $LaCuO_3$, $LaCoO_3$, $(La_{1-x}Sr_x)CoO_3$, $(La_{1-x}Sr_x)CrO_3$, $(La_{1-x}Sr_x)CrO_{3-\delta}$ or $SrFeO_3$. The layer perovskite oxides are represented by $A_2BO_4$, wherein A is a rare earth metal and B is a transition metal, typically $LaCuO_4$, as shown in FIG. 3 in which K, Ni and F correspond to La, Cu and O, respectively, or $La_2NiO_4$. The oxygen-dificient layer perovskide oxides have a structure of $AB_2C_3O_{7-x}$, wherein A is Y, La, Nd, Dy, Sm, Eu, Gd, Ho, Tm or Yb, B is Ba, Sr, Ca or Sc and C is mainly Cu, such as $YBa_2Cu_3O_{7-x}$, $LnBa_2Cu_3O_{7-x}$ wherein Ln is a lanthanoid as indicated above, $YSr_2Cu_3\text{-}O_{7-x}$, $YBa_2CuO_3\text{-}xNi_xO_{7-y}$, $YBa_2Cu_{3-x}Ag_xO_{7-y}$, $YBaCaCu_3O_{7-x}$, $Y_{0.75}Sc_{0.25}Ba_2Cu_3O_{7-x}$ or $YBa_2Cu_3F_2O_y$. A typical example of the oxygen-dificient layer perovskite oxides is $YBa_2Cu_3O_7$ as shown in FIG. 4. The multilayer perovskite oxides have a structure of $A_2(B,C)_3D_{2+x}O_8$ or similar compositions wherein A is Bi or Tl, B is Ba or Sr, C is Ca and D is Cu, such as $Bi_4Sr_3Ca_3Cu_{4+x}O_{16}$ or $Tl_4Ba_2Ca_2Cu_{4+x}O_{16}$. A typical example of the multilayer perovskite oxides is $Bi_4Sr_3Ca_3Cu_{4+x}O_{16}$, as shown in FIG. 5.

In this invention, these superconductive oxides are either converted to non-superconductive oxides, or non-superconductive oxides having compositions capable of being converted to superconductive oxides are converted to the superconductive oxides by applying particle beams or electromagnetic radiations to these superconductive or non-superconductive oxides to increase or reduce the oxygen content of the oxides.

Furthermore, in this invention, superconductive devices can be made by utilizing the conversion either of from the superconductive oxides to non-superconductive oxides, or from the non-superconductive oxides to superconductive oxides as mentioned above.

The superconductive devices herein means any of a superconductive magnet, superconductive power transmission wire, superconductive transformer, superconductive shield, permanent current switch and electronic element such as semiconductor chip containing a superconductive circuit or wiring.

The "particle" of the particle beams used in this invention means ion, electron, neutron and etc. The "electromagnetic radiations" used in this invention mean laser light or infrared rays.

In order to enrich oxygen at the crystal lattice sites of non-superconductive oxides or superconductive oxides by applying the particle beams or electromagnetic radiations to these oxides so as to obtain a high Tc temperature, the particle is preferably oxygen ion or electron and the electromagnetic radiations are preferably laser light or infrared rays. The application of the radiations is preferably carried out while heating in an oxygen atmosphere.

In order to remove oxygen at the crystal lattice sites of non-superconductive or superconductive oxides by applying the particle beams or electromagnetic radiations to the oxides, the preferred particles are any ions of elements such as not only hydrogen and oxygen but also titanium, vanadium, chromium, manganese, iron, cobalt, nickel, zinc, silicon, nitrogen, aluminum and magnesium, electrons and neutrons. The particle beams, except for hydrogen beam, should have an energy exceeding that capable of displacing oxygen atoms at the crystal lattice sites of the oxides.

In order to convert superconductive oxides to non-superconductive oxides, the particle beams may be beams of not only hydrogen and oxygen but also titanium, vanadium, chromium, manganese, iron, cobalt, nickel, zinc, silicon, nitrogen, aluminum and magnesium, electron or neutron. These beams except for hydrogen ions are required to have an energy exceeding that capable of displacing oxygen atoms occupied at the crystal lattice sites. Furthermore, electromagnetic radiations used are preferably laser light or infrared rays. The application of the electromagnetic radiations is preferably carried out in an oxygen-free atmosphere.

As particles suitable for a particle beam by which fine radiation defects are introduced into superconductive oxides to improve the Jc of the oxides are preferred electrons and ions, particularly electrons, because the application of neutrons gives such drawbacks that oxides are radioactivated or such application requires a long period of time. The electrons and ions do not have such drawbacks. Furthermore, the electrons can control the size or distribution of the radiation defects introduced, with good accuracy. The amount of the electrons applied is preferably in the range of about 60 to 200% of that at which $Tc_{onset}$ begins to be reduced.

Figure 12:
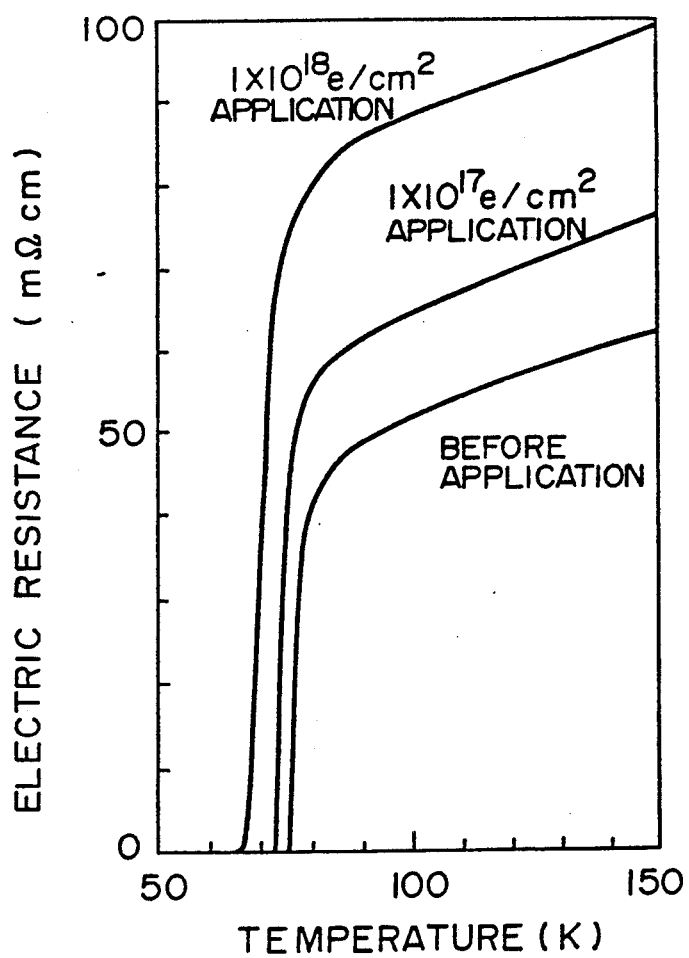
FIGS. 12 and 13 ar graphs of electrical resistance-temperature and a change of critical current density in a magnetic field, respectively, obtained when 2 MV electron beam was applied to $BiSrCaCu_2O_x$ thin films of 5 $\mu$m thick prepared by sputtering at room temperature.
Figure 13:
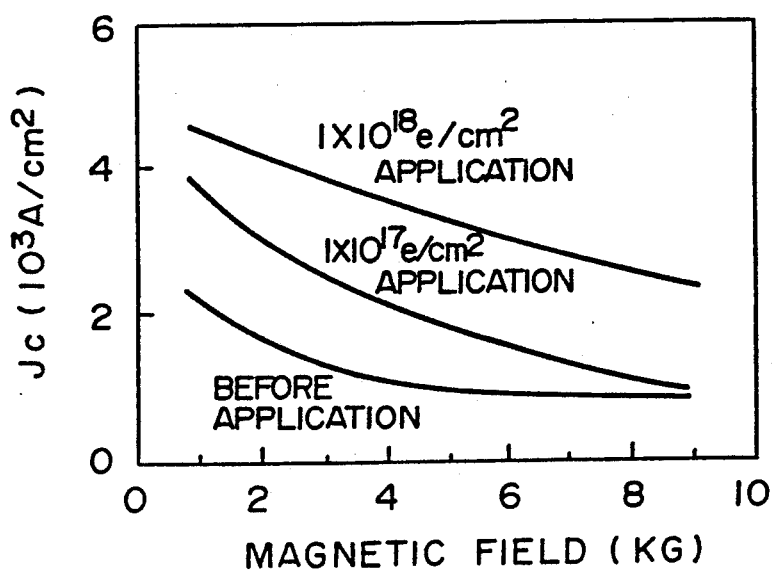

Other advantages of the process of this invention for producing superconductive oxides by application of particle beams and of the superconductive oxides will be briefly explained below. FIGS. 12 and 13 show the electric resistance-temperature curve and a change of the critical current density Jc in a magnetic field, respectively, of a $BiSrCaCu_2O_x$ thin film made by sputtering, with a 2 MV-electron beam applied at room temperature. This thin film was nearly in a monocrystal form. From FIG. 12 it is clear that the application of electrons tends to afford the reduction of Tc, and from FIG. 13, it is clear that the Jc in a magnetic field increases as the amount of electrons applied increases. The causes for this are considered that fine radiation defects introduced by the application of electrons function as pinning centers. As is seen from the foregoing, superconductive oxides improved in the Jc thereof by the well-controllable application of electrons or ions and superconductive devices using such superconductive oxide as elements fall within the scope of this invention.

In one aspect of this invention, superconductive devices can be prepared by applying particle beams or electromagnetic radiations to a non-superconductive or superconductive oxide layer at a predetermined region(s), said layer being formed on an insulative substrate, to convert the non-superconductive oxide to superconductive oxide and the superconductive oxide to non-superconductive oxide. In an embodiment of the superconductive devices, a superconductive region such as a circuit may be prepared within the non-superconductive layer by applying a particle beam or electromagnetic radiation to the layer at a predetermined circuit pattern. Similarly, in another embodiment, a beam or radiation-applied non-superconductive region or insulative region may be prepared within a superconductive layer formed on an insulative substrate.

In the above-mentioned three cases of oxygen-enriching a non-superconductive oxide or superconductive oxide, converting a non-superconductive oxide to a superconductive oxide and preparing the superconductive devices comprising a non-superconductive layer containing a superconductive region therein, the application of particle beams or electromagnetic radiations is preferably carried out while or followed by heat treating the oxides at a temperature between the complete solid solution temperature T of the oxides and T/3 (one-third of T), most preferably between T and 4/5T (four-fifth of T). These temperature ranges are suitable for recovering crystal lattices disordered by application of particle beams or electromagnetic radiations.

In this invention, there is provided a superconductive oxide having radiation defects introduced by applying particle beams, preferably an ion beam, most preferably an electron beam to the oxide. This superconductive oxide has a high critical current density Jc in a magnetic field. The amount of beam applied is preferably about 60-200% of that at which critical temperature Tc begins to be lowered by the application.

For applying ion beams, various ion accelerators may be used. For example, Cockcroft-Walton accelerator, Van de Graaff accelerator, Tandem accelerator, Kaufmann accelerator and etc. may be used. For applying electron beam, Linack accelerator or Cyclotron besides the Cockcroft-Walton accelerator may be used.

Figure 7:
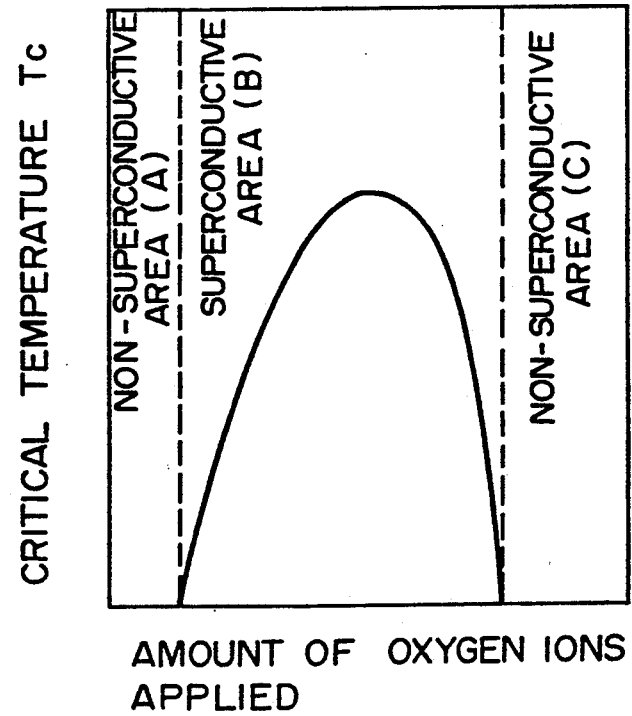
FIG. 7 is a graph showing a relationship between the amount of oxygen ions applied and the critical temperature.

The process for enriching oxygen at the crystal lattice sites of a non-superconductive or superconductive oxide by applying particle beams or electromagnetic radiations to the oxide will be detailedly explained below. For example, the oxygen-deficient layer perovskite oxide exhibits either superconductivity or non-superconductivity depending upon the oxygen content at the crystal lattice sites of the oxide. The present inventors have found that the non-superconductive oxide can be converted to a superconductive oxide and the critical temperature Tc of the superconductive oxide can be raised up by applying oxygen ion beam, or applying electron beam, laser or infrared rays in an oxygen atmosphere. FIG. 7 qualitatively shows an example thereof. Application of oxygen ions at a certain amount to an oxygen-highly deficient trilayer perovskite oxide (non-superconductive area A) allows the oxide to be converted to a superconductive oxide exhibiting a critical temperature. Furthermore, Tc increases as the amount of oxygen ions applied increases. However, further continued application of oxygen ions allows the Tc to reach the maximum but still further continued application allows the Tc to decrease as the amount of oxygen ions applied increases, and eventually reach the non-superconductive area C in FIG. 7. The amount of oxygen ions applied at which the Tc reaches the maximum is affected by the applying temperature and applying dose and not linearly determined. The higher the applying temperature and the applying dose, there is a tendency for the amount of oxygen ions applied to increase to a level at which Tc reaches a maximum. On the other hand, when the amount of oxygen ions applied exceeds a certain value, the Tc begins to decrease, because oxygen atoms at crystal lattice sites are preferentially displaced due to radiation defects by applying oxygen ion beam to reduce the oxygen content at crystal lattice sites. This was confirmed during application of oxygen ions by in-situ observation with a lattice image through a 200 keV electron microscope provided with an ion accelerator. Therefore, it is considered that the peak of the curve in FIG. 7 showing a relationship between a Tc and an amount of oxygen ions applied is produced by concurrence of the reaction in which oxygen atoms applied are introduced into the lattice sites and the reaction in which oxygen atoms are displaced from their lattice sites when applied. Thus, in order to raise up the Tc, oxygen atoms are preferably introduced by applying oxygen beam into the lattice sites until the Tc reaches the peak as shown in FIG. 7.

Figure 8:
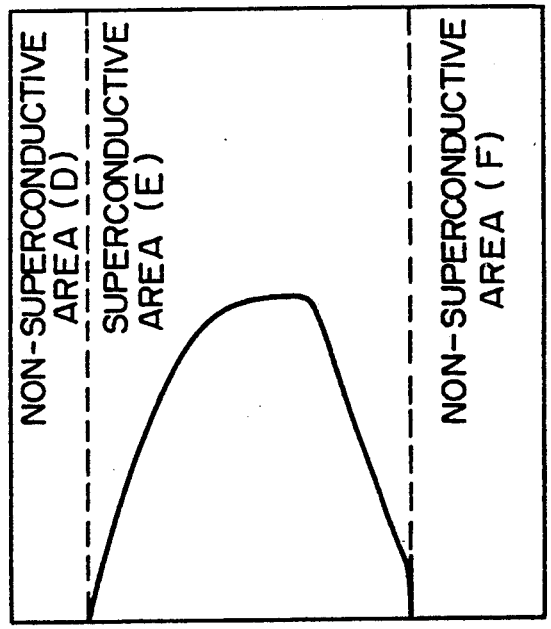
FIG. 8 is a graph showing a relationship between the energy density of electron beams, laser beams or infrared rays and the critical temperature.
Figure 9:
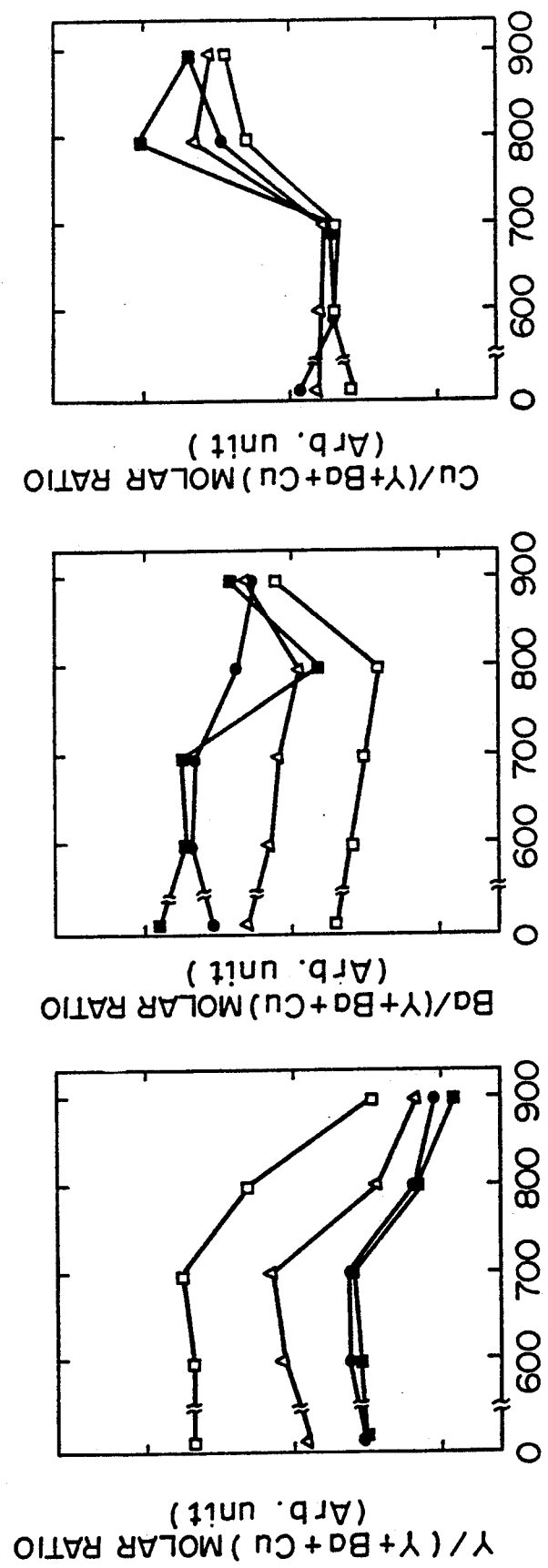
FIGS. 9A, 9B and 9C are graphs showing a relationship between the Y/(Y+Ba+Cu), Ba/(Y+Ba+Cu) and Cu/(Y+Ba+Cu) molar ratios, respectively, and the temperature of $YBa_2Cu_3O_{7-x}$ elevated when a laser beam applied.

On the other hand, as a process for raising up the Tc by converting a non-superconductive oxide within the area A of FIG. 7 to a superconductive oxide, application of electron beam, laser light or infrared rays in an oxygen atmosphere is effective an example of this process is diagrammatically shown in FIG. 8. The application of electron beam, laser light or infrared rays to an oxygen-highly deficient triple layer perovskite oxide (non-superconductive area D) in an oxygen atmosphere allows the oxide to be converted to a superconductive oxide exhibiting a critical temperature when the energy density exceeds a certain value. Furthermore, the Tc increases as the energy density increases. There is a limited range of energy density within which the Tc is permitted to increase. If the energy density is too high, the Tc is rapidly reduced or the oxide is again converted to a non-superconductive oxide (area F in FIG. 8). The mechanism by which non-superconductive oxides are converted by applying electron beam, laser light or infrared rays onto the oxides to superconductive oxides, is considered that the non-superconductive oxides are heated by the application at the applied regions thereof, in which oxygen atoms are introduced (oxidization) from the ambient atmosphere, so that the enrichment of oxygen at the crystal lattice sites are attained. On the other hand, if the energy density of particles applied is too high, the Tc is reduced or the superconductive oxides are again converted to non-superconductive oxides (area F in FIG. 8). This conversion is considered to occur due to the change of structure by the increase of temperature accompanied by evaporatoin of constituent elements of the superconductive oxides, melting of the oxides or amorphization of the oxides. For example, FIGS. 9A, 9B and 9C are graphs showing a relationship between the Y/(Y+Ba+Cu), Ba/(Y+Ba+Cu) and Cu/(Y+Ba+Cu) molar ratios, respectively, and the temperature of $YBa_2Cu_3O_{7-x}$ elevated when a laser light applied, and they illustrate that the composition of the oxide are changed by heating. This oxide, $YBa_2Cu_3O_{7-x}$, is a thin film prepared on an MgO substrate by RF magnetron sputtering. It is clear that the composition of the oxide is remarkably changed when its temperature exceeds 700° C.

Figure 10:
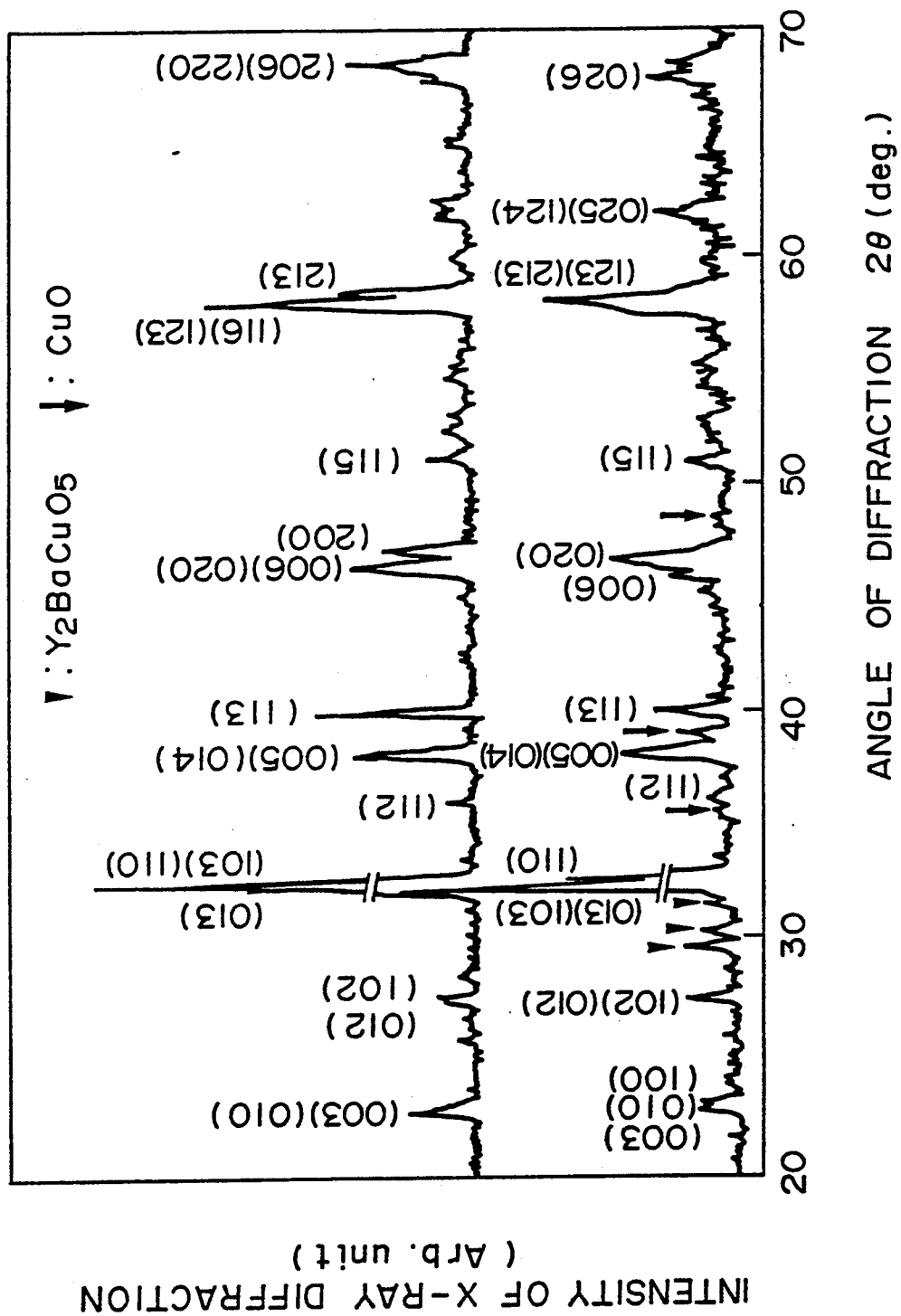
FIG. 10 shows two X-ray diffraction patterns evidencing that reduction of oxygen in an oxide superconductor takes place when a hydrogen ion beam applied.

The effect of the radiation defects by which oxygen atoms at crystal lattice sites are displaced, as referred to with FIG. 7, is not only produced by application of oxygen ions but also by application of various other ions, electron or neutron. However, application of hydrogen ions permits the oxygen content at crystal lattice sites of oxides to be reduced through a specific mechanism other than the displacement of oxygen atom. That is, hydrogen ions applied and introduced into oxides cut preferentially bonds of copper atoms and oxygen atoms which are considered to contribute to superconduction, so that the oxygen atoms of the superconductive oxides are reduced with ease. FIG. 10 shows two X-ray diffraction patterns evidencing that reduction of oxygen in an oxide superconductor takes place when a hydrogen ion beam is applied. In FIG. 10, the upper pattern is directed to a non-applied thin film (10 vm in thickness) of $YBa_2Cu_3O_{7-x}$ as prepared by RF magnetron sputtering, whereas the lower pattern concerns the same film to which a hydrogen ion beam of 400 keV was applied at a dose of $10^{17}H^+/cm^2$ and at room temperature. It is apparent from FIG. 10 that the non-applied oxide was in a single orthorhombic phase of $YBa_2Cu_3O_{7-x}$ and the applied oxide was transformed into a tetragonal phase of $YBa_2Cu_3O_{7-x}$ and new phases of $Y_2BaCuO_5$ and $CuO$ were produced. The transformation of $YBa_2Cu_3O_{7-x}$ from the orthorhombic phase to the tetragonal phase takes place when the oxygen content of $YBa_2Cu_3O_{7-x}$ is reduced. So the transformation reveals that the oxygen content is reduced by application of a hydrogen ion beam. This is explained by the following chemical equations:

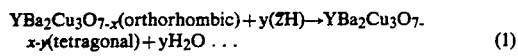

$YBa_2Cu_3O_{7-x}$(orthorhombic)$+y(2H)\rightarrow YBa_2Cu_3O_{7-x-y}$(tetragonal)$+yH_2O$ ... (1)

That is, hydrogen atoms introduced by application of a hydrogen ion beam reduces oxygen to induce the transformation from the orthorhombic phase to the tetragonal phase. According to the equation (1) above, $H_2O$ must be formed. The formation of $H_2O$ can be rationally elucidated by the fact that $Y_2BaCuO_5$ and $CuO$ were newly formed by application of a hydrogen ion beam. In short, the reaction of $YBa_2Cu_3O_{7-x}$ with $H_2O$ can be represented by the following equation:

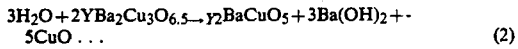

Figure 11:
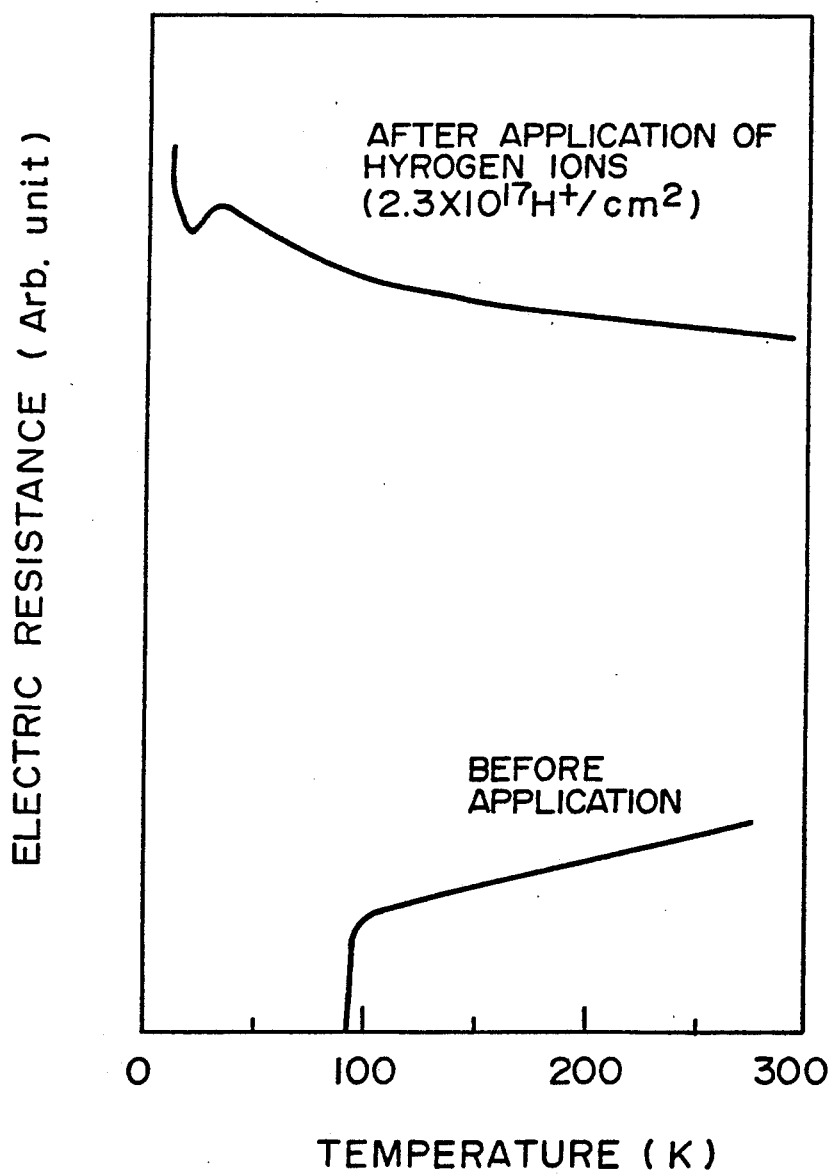
FIG. 11 is an electrical resistance-temperature graph showing that a superconductive $YBa_2Cu_3O_{7-x}$ oxide in a thin film can be converted to a non-superconductive oxide when a hydrogen beam applied.

$3H_2O+2YBa_2Cu_3O_{6.5}\rightarrow Y_2BaCuO_5+3Ba(OH)_2+5CuO$ ... (2)

when x is 0.5 for convenience. In this equation, $Ba(OH)_2$ is not crystallized and hence there appear no peaks of $Ba(OH)_2$ in the X-ray diffraction patterns of FIG. 10. Thus, the application of a hydrogen ion beam to a superconductive oxide allows oxygen atoms at crystal lattice sites to be reduced with ease. FIG. 11 is an electric resistance-temperature curve evidencing that the thin film of a superconductive oxide, $YBa_2Cu_3O_{7-x}$, referred to in FIG. 10 can be converted to a non-superconductive oxide.

As is clear from the foregoing, one aspect of this invention is to provide a process for forming a non-superconductive oxide region in a superconductive oxide layer falling within superconductive area B or E of FIG. 7 or 8 by the method for reducing the oxygen content of the superconductive oxide, as explained above and further to provide a superconductive device such as a superconductive circuit or wiring by forming non-superconductive regions of a predetermined pattern in a superconductive oxide layer through the above-mentioned process. Furthermore, another aspect of this invention is to provide a semiconductor device comprising semiconductor elements having the superconductive circuit or wiring formed thereon by the above-mentioned process.

FIGS. 12 and 13 show an electric resistance-temperature curve and a change of critical current density in a magnetic field, respectively, of a thin film (5 μm thick) of $BiSrCaCu_2O_x$ prepared by sputtering in applying an electron beam of 2 MV to the thin film at room temperature. The thin film is nearly in a monocrystal form. It is seen from FIG. 12 that Tc tends to decrease as the amount of the electron beam applied increases, whereas it is seen from FIG. 13 that Jc tends to increase as the amount of the electron beam applied increases. Thus, it is also within the scope of this invention to raise up the critical current density Jc of a superconductive oxide by applying an ion beam, electron beam or neutron beam to the oxide.

The invention will be illustrated with reference to some exmaples below.

EXAMPLE 1

Figure 14:
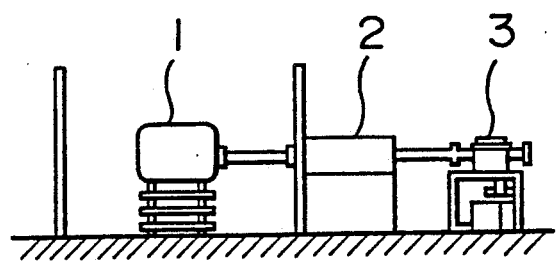
FIG. 14 is a pictorial view of an ion accelerator of a Cockcroft-Walton type used in the examples of this invention.
Figure 15:
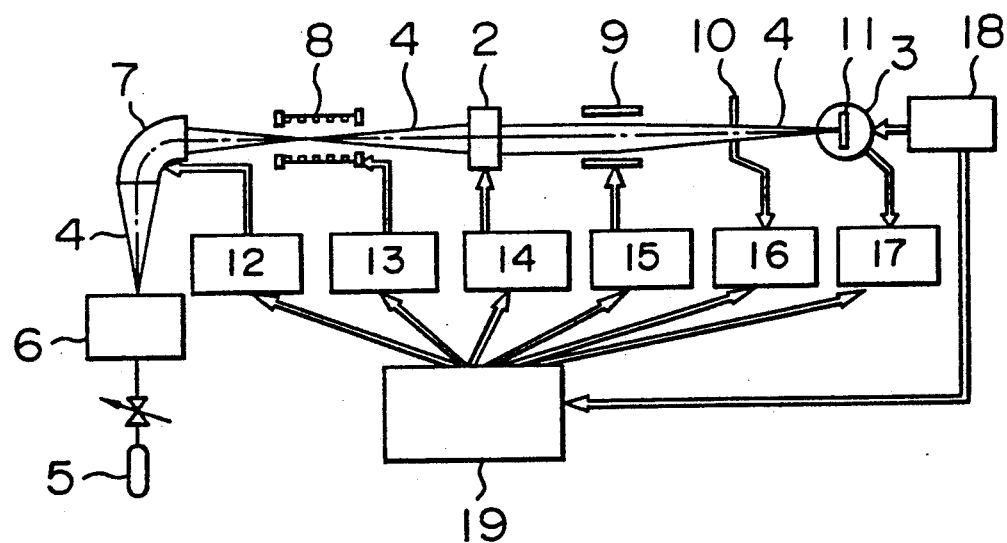
FIG. 15 is a diagram explaining the structure of the ion accelerator shown in FIG. 14 and illustrating the path of an ion beam.

This example is one of embodiments of a process for controlling the oxygen content at the crystal lattice sites of non-superconductive oxides or superconductive oxides by applying oxygen ions to the oxides. Table 1 shows samples and a method for preparing the samples. Sixty (60) samples in total of six kinds of compositions wherein x is 0.05, 0.1, 0.2, 0.3, 0.4 and 0.5, were prepared as shown in Table 1. These samples were injected by oxygen ions to $1\times 10^{17}$ ions/cm² with a Cockcroft-Walton ion accelerator. This ion accelerator was operated under the following conditions: an accelerating voltage of 0.4 MeV, a degree of vacuum of $10^{-6}$ to $10^{-7}$ Torr in a sample chamber or vacuum chamber and a temperature of 870° to 1100° K. FIG. 14 is a pictorial view of the appearance of the ion accelerator. FIG. 15 is a diagram illustrating the structure of the ion accelerator as shown in FIG. 14, and the path of an ion beam. Oxygen to be injected is supplied from oxygen bottle 5 to ion source 6, to which high voltage is applied to form oxygen ions. An ion beam is injected into sample 11 in vacuum chamber 3 through quaternary polar lens 2, polarizer 9 and slit 10 from accelerator 1 constituted by ion source 6, mass spectrometer 7 and accelerating tube 8. A carbonic acid gas bottle may be used in place of the oxygen bottle to generate oxygen ions. Furthermore, electromagnet 12, ammeter 13 for the accelerating tube, power source 14 for the quaternary polar lens, ammeter 15 for the polarizer, ammeter 16 for the slit, ammeter 17 for target and temperature-measuring and regulating element 18 are connected to microcomputer 19 and regulated by the microcomputer so as to maintain the injection conditions to be constant. The oxygen ion-injection was carried out on the thin film samples at both the sides thereof under the same conditions, except for Groups C and D.

Figure 16:
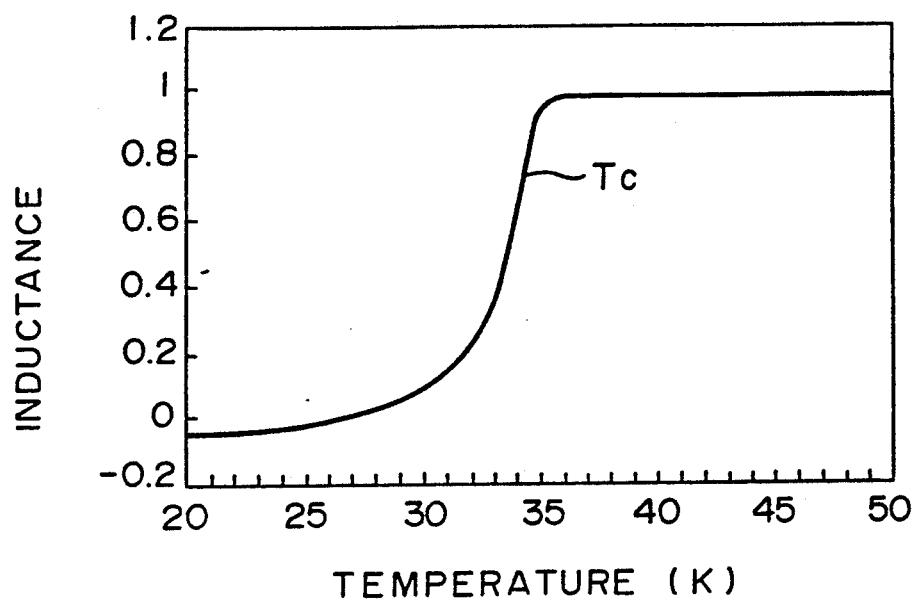
FIG. 16 is a graph showing a relationship between an absolute temperature and inductance measured in Example 1.

The samples injected by oxygen ions were cooled to the temperature of liquid helium. During the cooling, a change of inductance was measured by an inductance method, to examine the critical temperature Tc. FIG. 16 is a graph showing an example of the measurements for the samples (for Sample No. 1 shown in Table 1, wherein x is 0.1). In FIG. 16, the abscissa indicates absolute temperature and the ordinate inductance. In the example, it is clear that Tc is 35° K.

Table 2 shows an increase or decrease of the critical temperature Tc of the samples treated above compared with that of a non-injected sample measured in the same manner. The sample having a decreased Tc was recovered or improved by annealing after the ion-injection.

Table 3 shows a proportion of a difference in an increase of temperature between the maximum $Tc_{max}$ of the sample ion injected by the accelerator and the critical temperature $Tc^0$ of a non-injected sample to $Tc^0$ $(Tc_{max}-Tc^0)/Tc^0$. The proportion varies depending upon the values of x of the samples but it is clear that all the samples had a Tc increased by the process of this invention. The superconductive oxides, as shown in Table 3, having a higher Tc than the $Tc^0$, obtained by controlling the oxygen content of the oxides according to the process of this invention fall within the scope of this invention.

EXAMPLE 2

Figure 17:
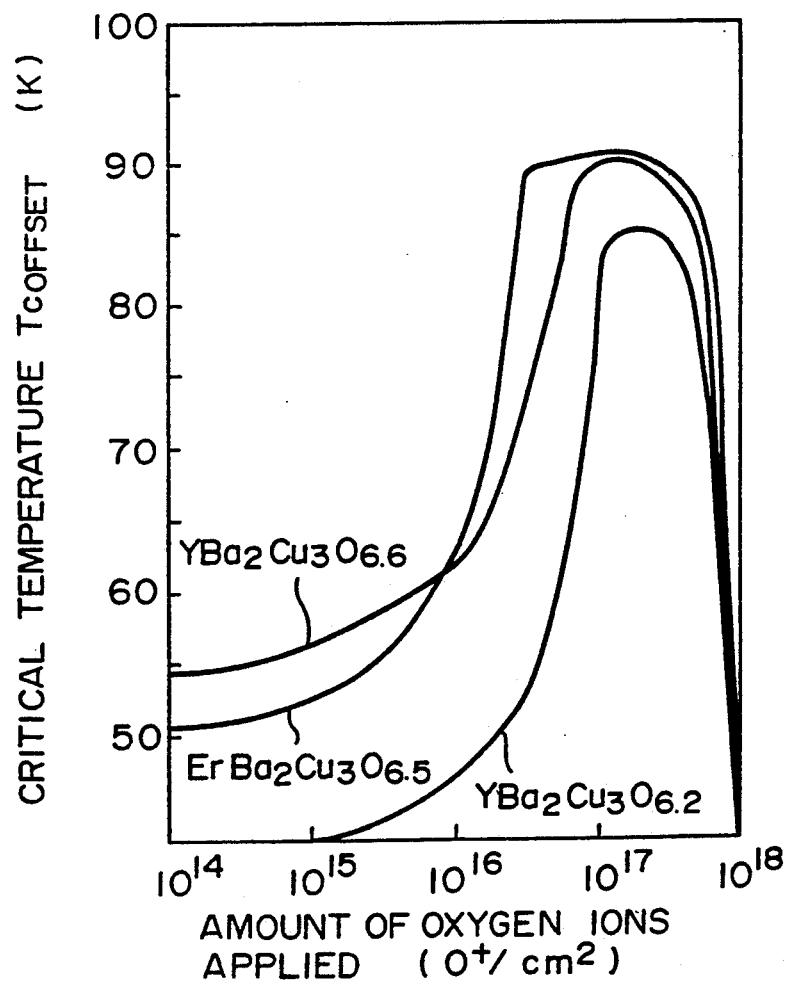
FIG. 17 is a graph showing a relationship between $Tc_{offset}$ and the amount of oxygen ions applied of a sample measured in Example 2.

The application of oxygen ions was carried out in the same manner as in EXAMPLE 1. Samples were thin films (1–2 μm thick) of $YBa_2Cu_3O_{6.2}$, $YBa_2Cu_3O_{6.6}$ and $ErBa_2Cu_3O_{6.5}$ prepared on MgO substrates by the RF magnetron sputtering. This application of oxygen ions were carried out with a Cockcroft-Walton ion accelerator (FIGS. 14 and 15) at 75 keV and 1110°±30° K. FIG. 17 shows a change of the $Tc_{offset}$ of the samples with respect to the amount of oxygen ions applied. Before the application of oxygen ions, $YBa_2Cu_3O_{6.2}$ was a non-superconductor, $YBa_2Cu_3O_{6.6}$ was a superconductor having a $Tc_{offset}$ of 54K, and $ErBa_2Cu_3O_{6.5}$ was a superconductor having a $Tc_{offset}$ of 51K. The application of oxygen ions allowed the non-superconductor to be converted to a superconductor, and the Tc of the superconductors was raised up until the amount of oxygen ions applied reached a certain level, as shown in FIG. 17. Further increase in the amount of oxygen ions applied begins to allow the oxygen atoms at the crystal lattice sites to be displaced, so that the Tc was reduced. The application of $10^{19}$ O+/cm² allowed all the samples to be converted to non-superconductors.

EXAMPLE 3

Figure 18:
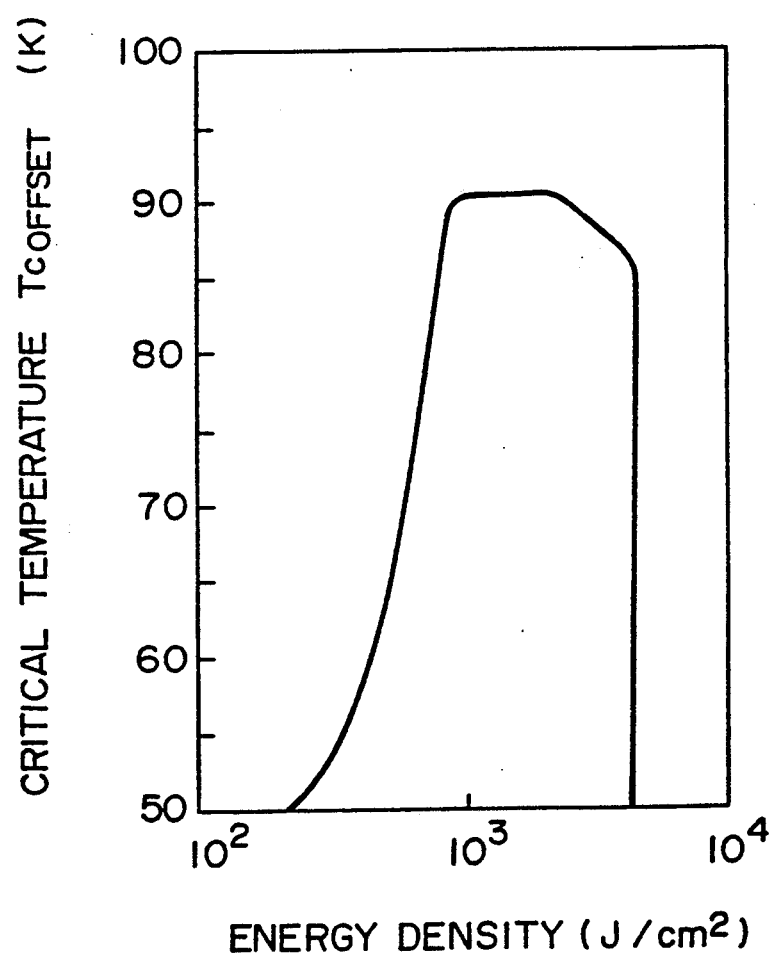
FIG. 18 is a graph showing a relationship between the $Tc_{offset}$ and energy density of a non-superconductive oxide, $YBa_2Cu_3O_{6.2}$, when a carbonic acid gas laser or electron beam applied in Example 3.

Pellet samples of a non-superconductive $YBa_2Cu_3O_{6.2}$ with 25 mm in length, 6 mm in width and 3 mm in thickness were prepared by the oxide-mixing method. FIG. 18 is a graph showing a change of the critical temperature of the samples, as carbonic acid gas laser or electron beam is applied to the samples, with respect to the energy density applied. The electron beam was applied at a range of 50 to 100 keV. In both the cases of applying the electron beam and the carbonic acid gas laser, the similar results were obtained. The transformation from the non-superconductive form to the superconductive form began to occur at an energy density of about $1 \times 10^2$ J/cm². The critical temperature increased as the energy density increased, but it began to decrease when the energy density exceeded about $2 \times 10^3$ J/cm², and the samples began to be molten at about $4.3 \times 10^3$ J/cm² to be again transformed to the non-superconductive form.

EXAMPLE 4

Figure 19:
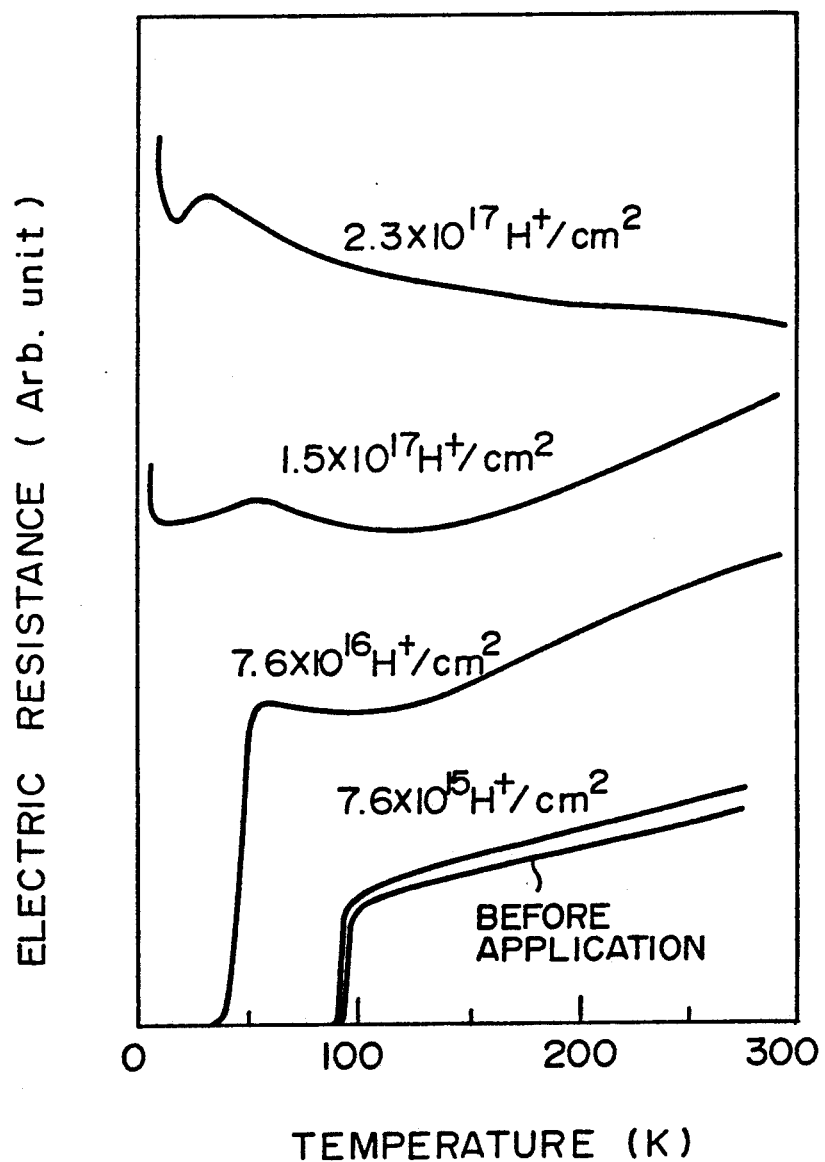
FIG. 19 is a graph showing an influence of an amount of hydrogen ions applied on an electric resistance-temperature curve of a $YBa_2Cu_3O_{7-x}$ thin film prepared by RF sputtering, in Example 4.

A thin film sample (5 μm in thickness) of $YBa_2Cu_3O_{7-x}$ was prepared on a substrate of MgO by RF megnetron sputtering. FIG. 19 is a graph showing an influence of an amount of hydrogen ions applied on a electric resistance-temperature curve of the sample when a 400 keV hydrogen ion beam was applied. The application was carried out at room temperature with a Cockcroft-Walton accelerator. The $Tc_{offset}$ of the sample began to decrease when the amount of hydrogen ions applied exceeded the order to $10^{15}$ H+/cm². The sample was converted to a non-superconductive oxide at an applied amount of an order of $10^{17}$ H+/cm².

EXAMPLE 5

Semiinsulative layer 12 having a composition of $YBa_2Cu_3O_{6.0}$ and a thickness of about 200 nm was formed by sputtering on substrate 11 of an Si single crystal having a crystal direction of (100). The resultant sample was heated to 1000° C. for about 1 hour under vacuum and then cooled. Selected part of the semiinsulative layer 12 was heated to a temperature of 800° to 500° C. (at least 500° C.) with laser light 14 from $CO_2$ laser 15 or an infrared ray in pure oxygen of 1 atm. At the heated part the composition was converted to $YBa_2Cu_3O_7$ (superconductor 13). The contour of the superconductor 13 could optionally be made by moving beam spot 16. (The contour can also be made by moving the substrate 11 or sweeping the laser light with an optical means.) According to this example, a semiinsulative substrate was automatically made of the semiinsulative layer 12, so that the superconductor 13 was embedded into the semiinsulative substrate or semiinsulative layer 12. The top surfaces of the semiinsulative layer 12 and the superconductor 13 were in the same plane or had no step formed therebetween. Therefore, high integration of circuits using the superconductor 13 is advantageously possible. The minimum size of the superconductor 13 is predominantly determined by the diameter of the beam spot 16 or the laser light 14. The diameter may be as small as 1 μm.

In this example, the locallized oxidation of the semiinsulative layer 12 was carried out by heating with a laser light in oxygen as mentioned above, but this heating with a laser light may be replaced with high-frequency heating to a temperature of 800° to 500° C. The oxygen pressure is not limited to 1 atm. To oxide the locallized parts effectively, it is desirably higher than 1 atm at a temperature of 800° to 500° C. Further, a cooling rate after the heating may vary depending upon the sweeping rate of the spot of laser light. However, for the purpose of obtaining a small amount of crystal faults, the sweeping rate is as low as possible and the coolihg rate is desirably maintained at about 5 deg/minute down to about 500° C.

Figure 20:
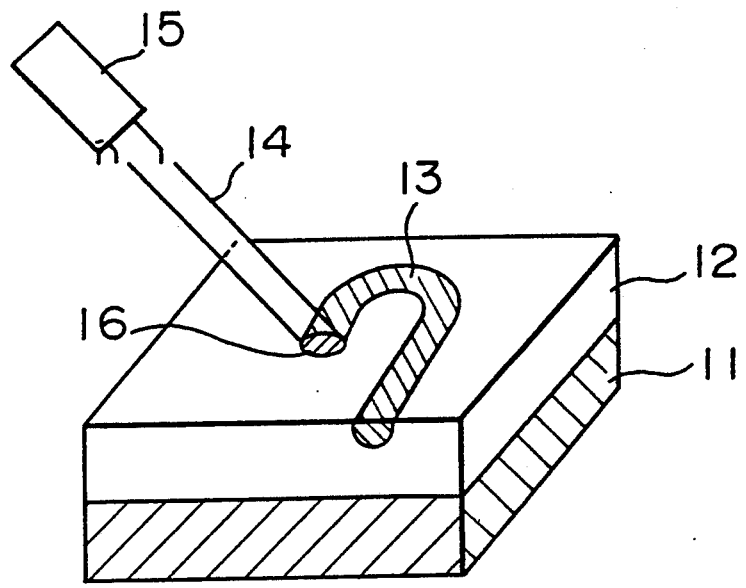
FIG. 20 is a pictorial view illustrating a way of producing a superconductive region within a semiinsulative layer in Example 5.
Figure 21:
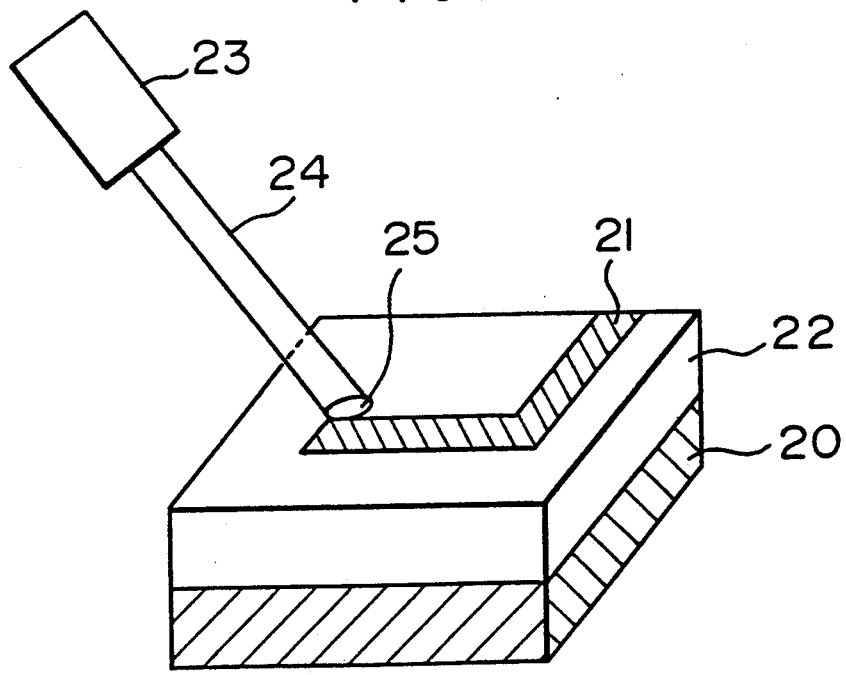
FIG. 21 is a pictorial view of illustrating a way of producing a semiinsulative region within a superconductive layer in Example 6.

In the example as shown in FIG. 20, the superconductor 13 may be used as wiring of circuits.

EXAMPLE 6

Contrary to the EXAMPLE 5 in which the semiinsulative layer 12 was preformed, superconductive layer 22 was preformed on substrate 20. This superconductive layer 22 was applied by hydrogen ion beam 24 from hydrogen ion source 23. The superconductive layer 22 may be reduced and converted to semiinsulative layer 21 at the beam spot 25. In this example, the superconductive layer 22 constituted a wiring. In applying hydrogen ion beam 24, the substrate 20 is desirably heated to about 500° C. but this heating is not always necessary. In this example, hydrogen ion beam was used for converting the superconductive layer 22 to the semiinsulative layer 21 but instead other reducing ion beams may be used. Further, heating under vacuum to 800° C. or higher by laser light or high-frequency allows oxygen to be dissociated in the region 21 and, therefore, such heating is also effective for achieving the object of this invention.

EXAMPLE 7

Figure 22A:
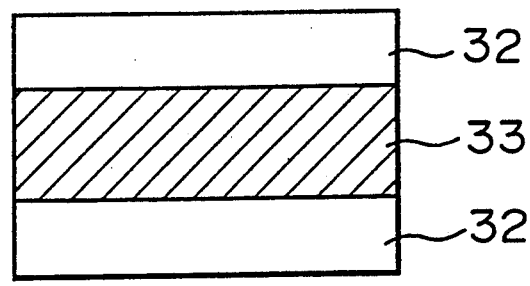
FIGS. 22(a) and 22(b) are diagrammatical cross-sectional views of an embodiment of this invention, i.e., a superconductive tunnel element of Example 7.
Figure 22B:
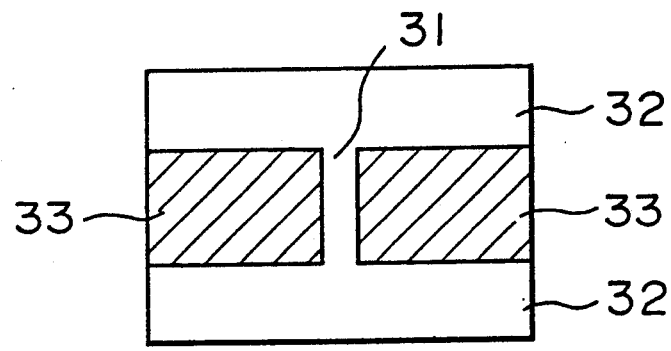

In this example, a tunnel element using the superconductive oxide was prepared according to this invention. Semiconductive layer 32 of $YBa_2Cu_3O_{5.0}$ having a thickness of about 200 nm were formed by sputtering on a silicon or saphire substrate. This layer on the substrate was subjected to the heat treatment in oxygen in the same manner and under the same conditions as in EXAMPLE 1. Thus, the superconductor 33 was formed as shown in FIG. 22(a). The width of the superconductor 33 was about 20 μm in this example but in general it is not particularly limited. Therefore, tunnel region 31 was formed by injecting hydrogen ions under the same conditions as in EXAMPLE 2, as shown in FIG. 22(b). The ion beam was converged so that the width of this region was about 10 to 50 nm. The tunnel region 31 may be converted to semiinsulator or conductor by changing an amount of ions injected. In both the cases it is apparent that it can be used as a superconductive weaklink. Thus, it is clear that a superconductive weaklink device having a flat structure can be prepared without using any photolithography or etching technique, according to the process of this invention.

EXAMPLE 8

Figure 23:
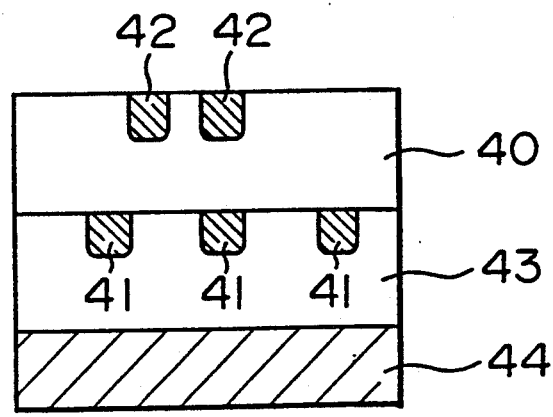
FIG. 23 is a diagrammatical cross-sectional view of an embodiment of this invention, i.e., a multilayer wiring board of Example 8.

This example will be described with reference to FIG. 23.

Semiinsulative layer 43 having a composition of $YBa_2Cu_3O_{5.0}$ was formed on substrate 44 of saphire in the same manner as in EXAMPLE 5 and then subjected to the local heat treatment in an oxygen atmosphere at a temperature of 800° to 500° C. in the same manner as in EXAMPLE 5 to form a first layer of superconductive wiring 41. Subsequently, a semiinsulative layer 40 having a composition of $YBa_2Cu_3O_{5.0}$ was formed on the first layer, and then subjected to local oxidation with a laser beam to form a second layer of superconductive wiring 42. Thus, it is clear that double-layer superconductive wiring can easily be realized according to the process of this invention. As is seen in FIG. 23, each layer was flat and hence multilayer wirings can also easily be realized to improve the performance of circuits.

These superconductive wirings can be used together with a semiconductor device such as a MOS transistor. In this example the oxide material was used as the superconductive or semiinsulative material having a composition of $YBa_2Cu_3O_{7-\delta}$, but Y may be replaced with Gd, Lu, Eu, Sc, Co, Sm, Nd, Yb, Tb or Ho and Ba with Sr or Ca to obtain the same effect.

EXAMPLE 9

Samples were a Y-Ba-Cu-O oxide prepared by RF magnetron sputtering (target materials: $Ba_2CuO_3$ and $Y_2O_3$; substrate material; saphire, $SrTiO_3$ and quartz; and substrate temperature: 700° C. or lower) and a monocrystalline La-Sr-Cu-O oxide prepared by molecular beam epitaxy. Both the samples had a thickness of about 0.5 to 1 μm.

Figure 24:
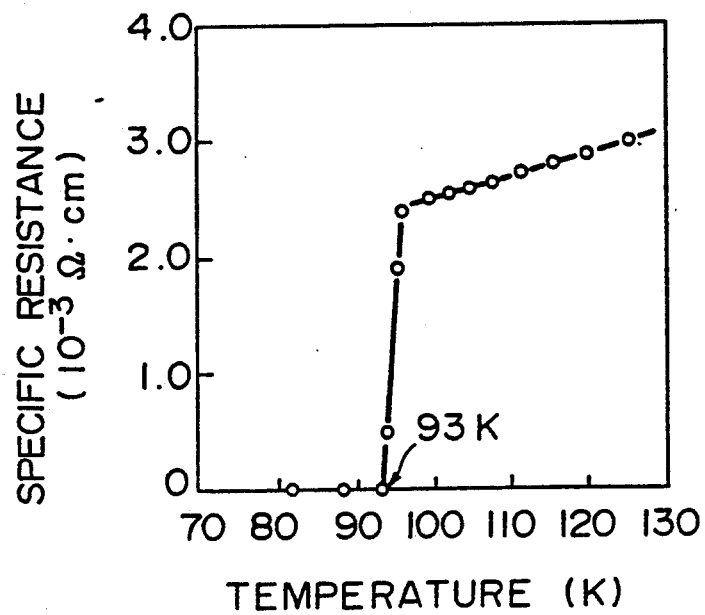
FIG. 24 is a graph showing a relationship between the specific resistance and temperature of a Y-Ba-Cu-O oxide in Exmaple 9.
Figure 25:
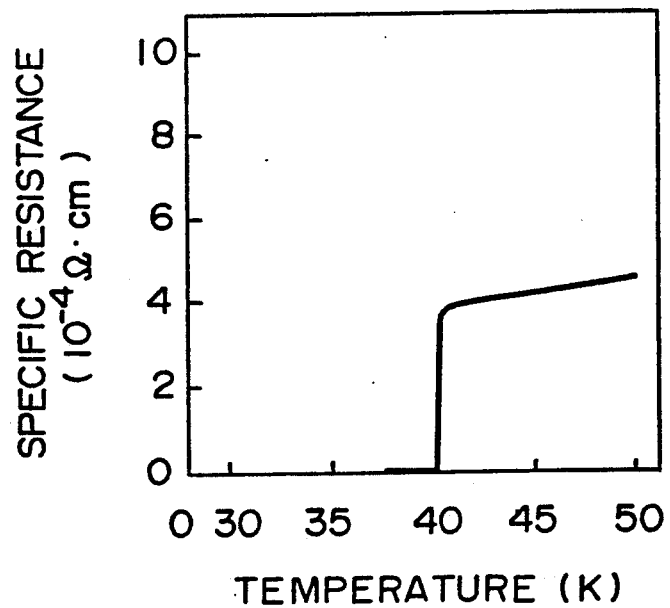
FIG. 25 is a graph showing a relationship between the specific resistance and temperature of a La-Sr-Cu-O oxide in Example 9.

FIGS. 24 and 25 are graphs showing a relationship between the specific resistance and the temperature of the samples, Y-Ba-Cu-O and La-Sr-Cu-O oxides, respectively.

Table 4 shows how to convert to non-superconductive oxides according to the process of this invention, whether or not the conversion to non-superconductive oxides occurred and whether or not the conversion to insulative oxides occurred. Even oxides not converted to insulative oxides exhibited a specific resistance of several figures higher than that as shown in FIG. 25 by choosing ion species and controlling the amount of ions doped. The ion doping was carried out by a Cockcroft-Walton accelerator or tandem type accelerator. These accelerators were properly used depending upon an accelerating voltage applied.

Figure 26:
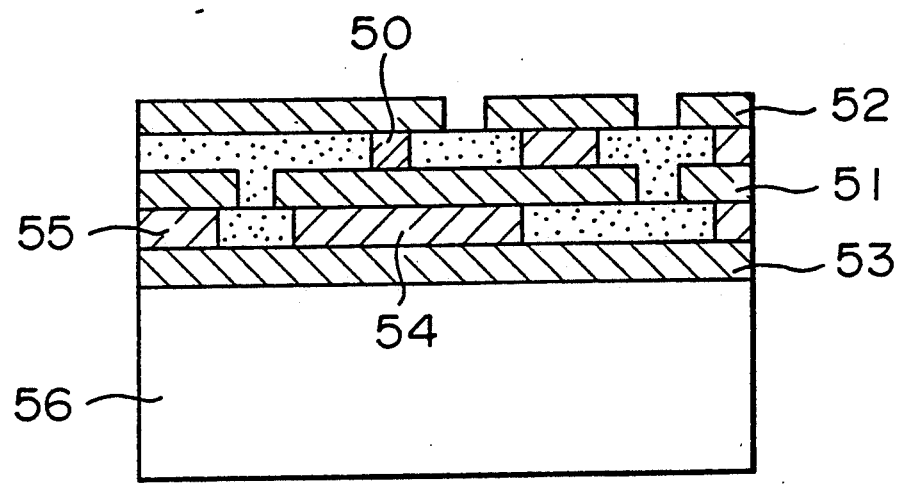
FIG. 26 is a diagrammatical cross-sectional view of an embodiment of this invention, i.e., a semiconductor device having a multilayer wiring board in Example 9.

FIG. 26 is a cross-sectional view of an example of semiconductive devices having the superconductive wiring boards prepared according to the process of this invention. That is, superconductive oxide 55 was formed by sputtering on insulative film 53 provided on semiconductive element 56 (at this stage regions 54 were the same material as the oxide 55). Thereafter, regions to become wirings were masked and selectively ion-doped to form insulative regions 54. This process was repeated to make a multilayer wiring board as shown in FIG. 26. Insulative regions 51 and 52 were formed by subsequent ion doping steps. Resistance 50 was also made by the ion-doping step.

EXAMPLE 10

Figure 27:
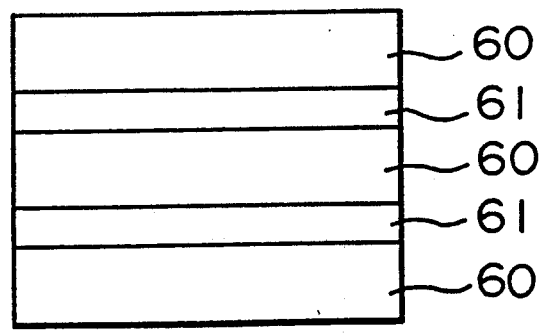
FIG. 27 is a diagrammatical view of a composite having three layers of a superconductive oxide of Example 10.

Conductive or insulative layer 61 was formed by ion doping on superconductive oxide layer 60 prepared by sputtering, vacuum evaporation or chemical vaporization. This step was repeated to form a composite comprising a three-layer structure which has two layers 61 interposed therebetween. FIG. 27 is a cross-sectional view of the composite. Thus, a composite having a structure of two or more layers of superconductive oxides and similar oxides integrated.

EXAMPLE 11

Figure 28A:
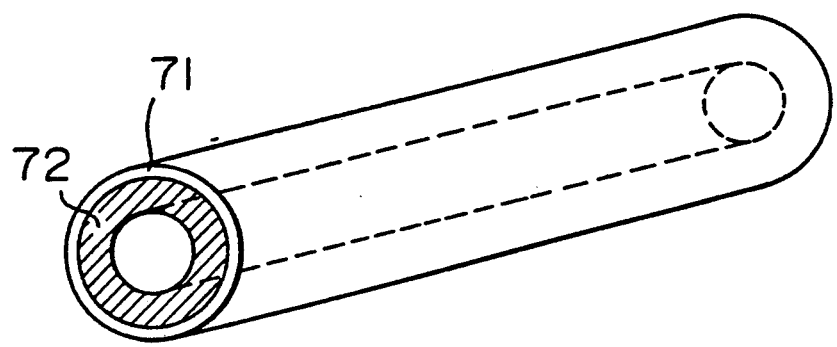
FIGS. 28(a), 28(b) and 28(c) are pictorial views of an embodiment of this invention, i.e., a superconductive coil of Example 11.
Figure 28B:
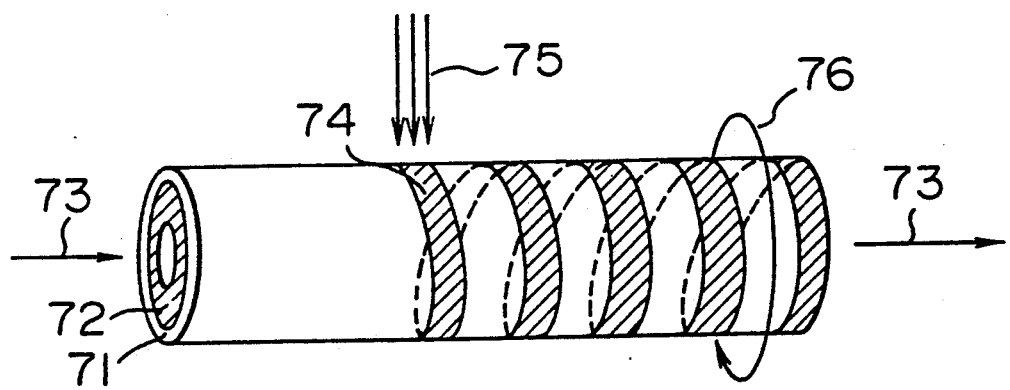
Figure 28C:
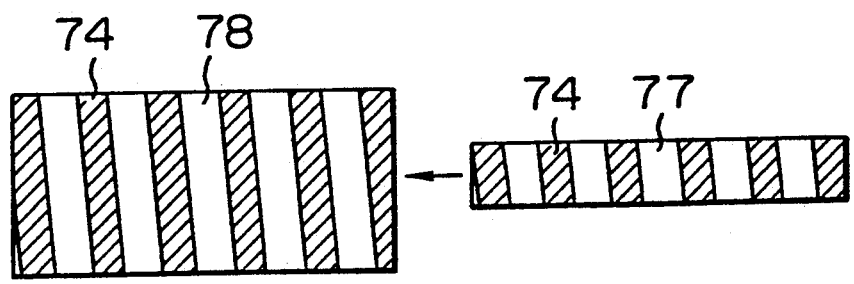

This example is directed to the preparation of a superconductive magnet element and will be described with reference to FIG. 28. $Y_2O_3$, $BaCO_3$ and CuO were weighed and mixed at a Y:Ba:Cu atomic ratio of 1:2:3, calcined at 900° C. for 24 hours and pulverized. The calcined powder was kneaded with pine oil and an organic binder to form a paste, which was then coated on the peripheral surface of cylindrical tube 72 of a non-superconductor such as Zr and heat treated at 950° C. for 1 hour to form superconductive layer 71, as shown in FIG. 28(a). The cylindrical tube coated with the superconductive layer as shown in FIG. 28(a) was rotated in a direction indicated by arrow 76 and at the same time moved in a direction indicated by arrow 73, while particle beam 75 was applied to the superconductive layer 71 at selected regions, as shown in FIG. 28(b). As particles of the particle beam 75 may be used whatever is capable of giving radiation defects to the superconductive layer 71, for example, ions or electrons. The particle beam 75 may be replaced with electromagnetic radiation such as laser and etc., particularly which is preferably a ray having an energy density in an order of $10^3$ J/cm². The region of the layer 74 on which the beam 75 was applied was converted to non-superconductive oxide in the same mechanism as in any of EXAMPLES 2 to 6 and 8 to 10. In this example, the non-superconductive region 74 was made in a spiral form as shown in FIG. 28(c), right-hand diagram. The non-applied region was a superconductive coil 77. One or more superconductive coils 78 having a size different from that of the superconductive coil 77 were made in the same manner as mentioned above, as shown in FIG. 28(c), left-hand diagram. The superconductive magnet element was made by coaxially inserting the coil 77 into the coil 78, as shown in FIG. 28(c). The superconductive layer 71 on the cylindrical tube as shown in FIG. 28(a) may not only be made by coating as mentioned above, but also by other ways such as solidification of a molten state. Furthermore, the outer surface of the non-superconductor 72, which has compositions capable of being converted to superconductive oxides, may be converted to a superconductor in the same manner as in EXAMPLES 1 to 3 to form the coil.

EXAMPLE 12

A superconductive magnet as shown in FIG. 29 was made by the process of this invention. Disks 190 of a superconductive oxide, which had a hole at the center thereof as shown in FIG. 29(a) were prepared. The same particle beam or electromagnetic radiation as in any of EXAMPLES 2 to 6 and 8 to 11 was applied onto these disks at the scroll part 81 thereof as shown in FIG. 29(b). This application to the scroll part 81 was carried out by masking scroll part 82 for some disks or converging and sweeping the beam or radiation onto the part 81 for the other disks. Thus, the part 81 was selectively converted by this application to a non-superconductive oxide and the remaining part 82 formed superconductive coil 191. Furthermore, superconductive coil 192 having a counterrotating scroll part as shown in FIG. 29(c) was made in the same manner as mentioned above. In FIGS. 29(b) and 29(c), this scroll part was formed in the direction of thickness at any cross-sections of the disks. Then, as shown in FIG. 29(d), the superconductive coil of FIG. 29(b) was converted to a non-superconductive oxide only on the surface thereof, except for the end 83 at the periphery of the part 82, and then also at the backside surface, except for the end 84 at the periphery of the central hole, in the same manner as mentioned above. Then, as shown in FIG. 29(e), the superconductive coil of FIG. 29(c) was also converted to a non-superconductive oxide only on both the front and backside surfaces thereof, except for the peripheral ends 84 and 83 of the respective surfaces, in the same manner as mentioned above. Thus, coils 193 of FIG. 29(d) and 194 of FIG. 29(e) were obtained. Then, the coils 193 and 194 were coupled to be a unit by putting the backside surface of coil 193 and the front surface of coil 194 on each other so that the end 84 of coil 193 and the end 84 of coil 194 were connected to each other. Some of the units were stacked so that the end 83 of one unit and the end 83 of another unit were connected to each other to form a long superconductive coil. The coupling was carried out by heat treatment under such conditions that the non-superconductive oxide was not converted to the superconductive oxide.

EXAMPLE 13

Figure 29A:
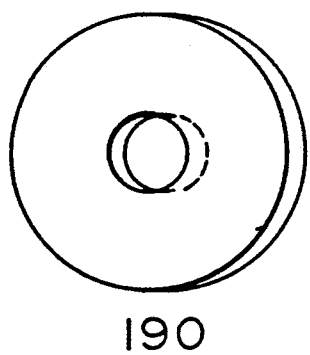
FIGS. 29(a), 29(b), 29(c), 29(d), 29(e) and 29(f) are pictorial views of an embodiment of this invention, i.e., a superconductive magnet of Example 12.
Figure 29B:
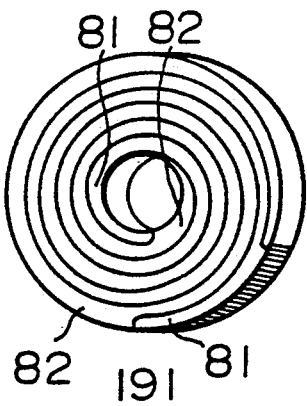
Figure 29C:
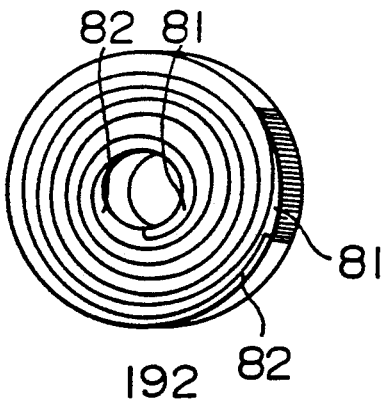
Figure 29D:
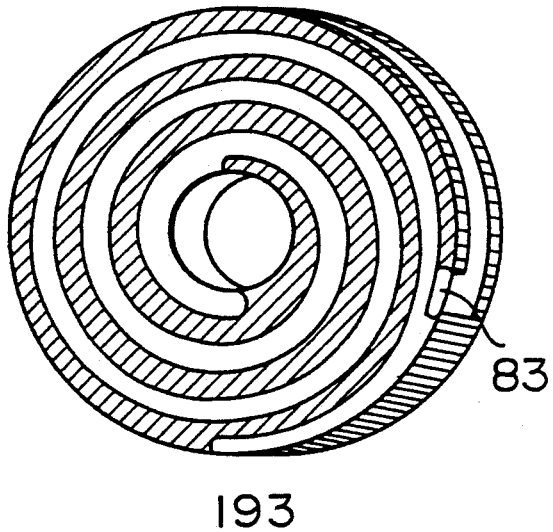
Figure 29E:
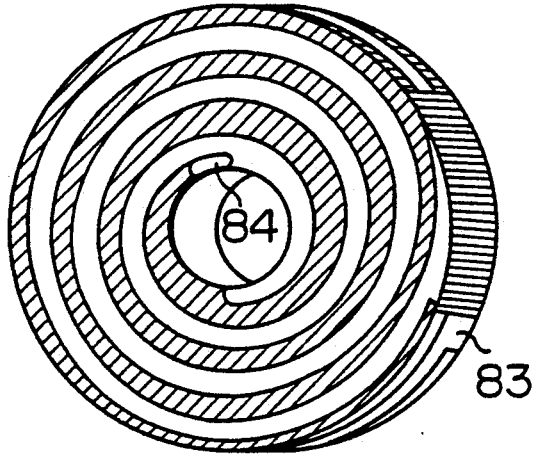
Figure 30A:
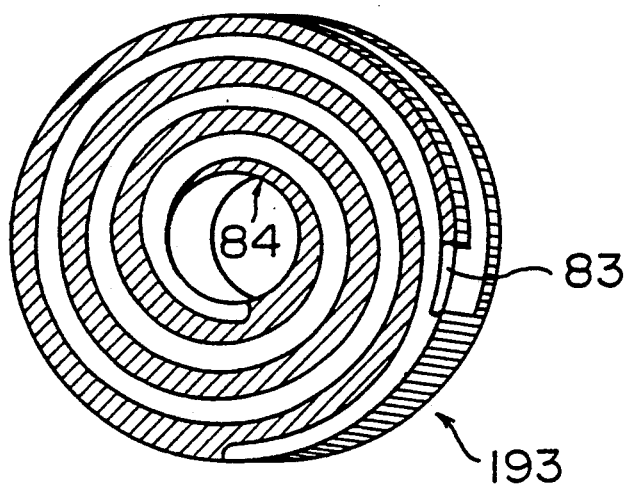
FIGS. 30(a) and 30(b) are pictorial views of an embodiment of this invention, i.e., a non-inductive winding of Example 13.
Figure 30B:
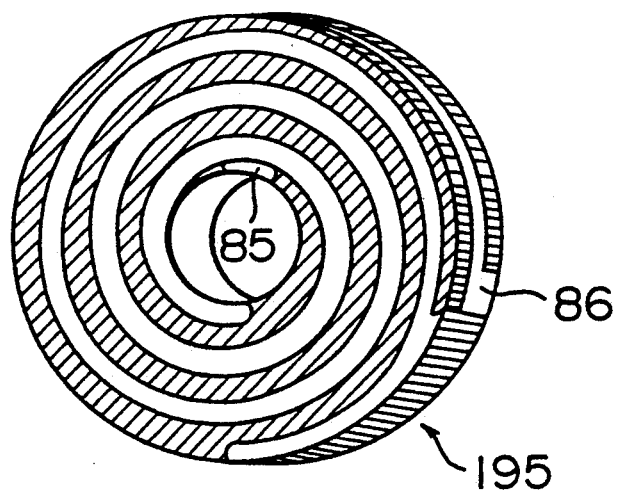
Figure 31:
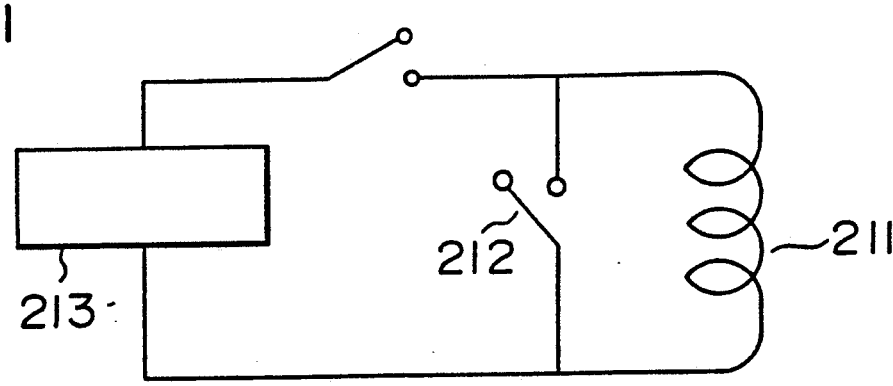
FIG. 31 is a diagrammatical view of a permanent current switch using the non-inductive winding of Example 13.

In this example, a non-inductive coil was made by the process of this invention. FIG. 30(a) shows the same coil as the coil 193 as shown in FIG. 29(d) for EXAMPLE 12. FIG. 30(b) shows coil 195 which was made by converting the superconductive oxide of the same coil as coil 191 of FIG. 29(b) only on both the front and backside surfaces thereof, except for the end 85 on the front surface at the inside periphery and the end 86 on the backside surface at the outside periphery. Thus, coil 195 was obtained. The end 84 of coil 193 was connected to the end 85 of coil 195 and then the end 86 of coil 195 to the end 83 of coil 193 by the same heat treatment as that of EXAMPLE 12. This connection was repeated to form the non-inductive superconductive coil. This non-inductive coil was used as a superconductive coil 211 of permanent current switch as shown in FIG. 31. On switching off at 212, electric resistance of 211 becomes higher. Therefore, the permanent current switch having a high performance was made. 213 denotes a direct current power source.

EXAMPLE 14

Figure 29F:
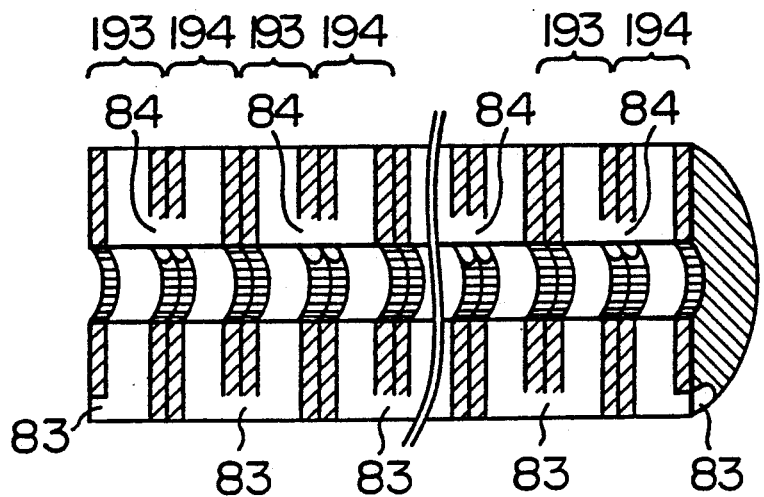

The size of the long coil as shown in FIG. 29(f) or the stacked number of coils 193 and 194 was changed. A transformer was made from the two long coils as a primary winding and a secondary winding, respectively. This worked as a superconductive transformer.

EXAMPLE 15

Figure 32A:
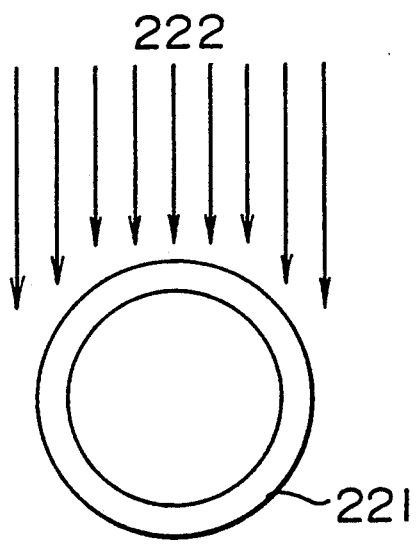
FIGS. 32(a) and 32(b) are diagrammatical views explaining shielding effects of a superconductive shield in Example 15.
Figure 32B:
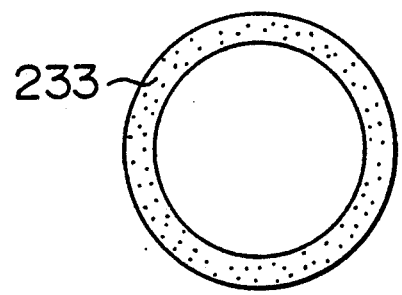

FIGS. 32(a) and 32(b) show an example of superconductive shields having an shielding effect improved by the process of this invention. In FIG. 32(a), 221 denotes a magnetic shielding device made of a superconductive oxide, $YBa_2Cu_3O_{7-x}$. To this device 221 was applied an electron beam of 2 MeV at 250° K. and $7 \times 10^{17}$ e/cm$^2$, thus obtaining a shielding device having radiation defects 223 introduced therein, as shown in FIG. 32(b). The Jc of the device 221 was raised from 800 A/cm$^2$ to about 1440 A/cm$^2$ (about 1.8 times). When a magnetic field was applied to the device, it was found that the shielding effect was improved.

EXAMPLE 16

Figure 33A:
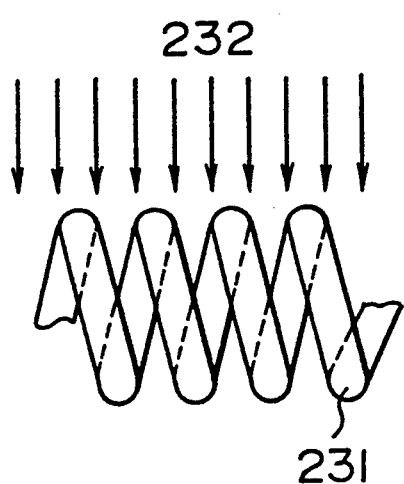
FIGS. 33(a) and 33(b) are diagrammatical views of a superconductive power transmission wire improved according to this invention.
Figure 33B:
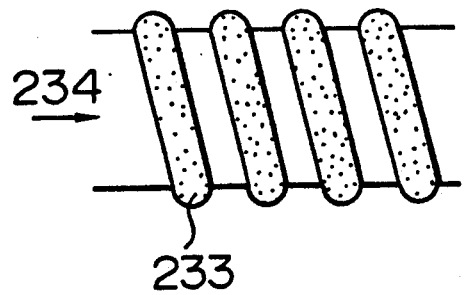

FIGS. 33(a) and 33(b) show an example of superconductive power transmission wires having a performance improved by the process of this invention. In FIG. 33(a), 231 denotes a power transmission wire comprising a superconductive oxide of $(La_{0.9}Sr_{0.1})_2CuO_3$. To this wire was applied an electron beam of 2 MeV at 250° K. and $5 \times 10^{17}$ e/cm$^2$, thus obtaining a power transmission wire having radiation defects 233 introduced therein, as shown in FIG. 33(b). The Jc of the wire as shown in FIG. 33(a) was 280 A/cm$^2$, wehreas the Jc of the wire as shown in FIG. 33(b) was about 1.5 times greater than that of the wire as shown in FIG. 33(a). Thus, it was found that the wire was improved by the treatment according to this invention. Liquid He as a cooling medium was indicated by 234.

TABLE 1

| Group | Process for Preparing Samples | Preparing Conditions, Size of Samples | | Composition of Samples | No. |
|---|---|---|---|---|---|
| A | Firing Process (Reaction Pressureless Sintering Process) | Calcining: | 900° C. × 5 hrs. in air heating, cooling rate 100° C./hr | $(La_{1-x}Sr_x)_2CuO_{4-y}$ | 1 |
| | | ↓ | | | |
| | | Pulverizing: | | $(La_{1-x}Ba_x)_2CuO_{4-y}$ | 2 |
| | | ↓ | | | |
| | | Drying: | 150° C. × 4 hrs. | $(Y_{1-x}Ba_x)_2CuO_{4-y}$ | 3 |
| | | ↓ | | | |

TABLE 1-continued

| Group | Process for Preparing Samples | Preparing Conditions, Size of Samples | Composition of Samples | No. |
|---|---|---|---|---|
| | | Pressing: 140 kg/cm² ↓ Sintering: 1100° C. × 10 hrs. Slicing in 0.1 mm thick | $(Y_{1-x/2}Sc_{1-x/2}Ba_x)_2CuO_{4-y}$ | 4 |
| B | Process for Adjusting Powder (Coprecipitation, Wet-Adjust.) Thin Film Method | Synthesis from Aqueous Solution of Salts, Final Size Slicing in 0.1 mm thick | $(La_{1-x}Sr_x)_2CuO_{4-y}$ $(La_{1-x}Ba_x)_2CuO_{4-y}$ $(Y_{1-x}Ba_x)_2CuO_{4-y}$ | 5 6 7 |
| C | Vacuum Evaporation (MBE Method) | Substrate: Saphire Monocrystal, R plane, Temp. of Substrate: −900° C. $O_2$ atmosphere: in order of $10^{-6}$ Torr Film thickness: −0.001 mm | $(La_{1-x}Sr_x)_2CuO_{4-y}$ | 8 |
| D | Sputtering | Substrate: Glass Gas: Ar + $O_2$, in order of $10^{-6}$ Torr Temp. of Substrate: −300° C. | $(La_{1-x}Sr_x)_2CuO_{4-y}$ | 9 |
| E | Liquid Quenching | Single rolling: Cooling rate: $10^{5°}$ C./sec Heating to hundreds °C. in $O_2$ atmosphere Film thickness: −0.03 mm | $(La_{1-x}Sr_x)_2CuO_{4-y}$ | 10 |

(x: $0.05 \leq x \leq 0.5$, y: unknown)

TABLE 2

| Sample No. | Increase or Decrease of Tc by Oxygen Ion Injection |
|---|---|
| 1 | Both |
| 2 | " |
| 3 | Increase |
| 4 | " |
| 5 | Decrease |
| 6 | " |
| 7 | " |
| 8 | Increase |
| 9 | Decrease |
| 10 | " |

TABLE 3

| Sample No. | $(Tc_{max}-Tc^0)/Tc^0$ (%) |
|---|---|
| 1 | 1–7 |
| 2 | 3–8 |
| 3 | 4–15 |
| 4 | 3–12 |
| 5 | 2–3 |
| 6 | 3–4 |
| 7 | 3–4 |
| 8 | 8–19 |
| 9 | 6–21 |
| 10 | 8–11 |

TABLE 4

| Sample | Contents of Treatments (This Invention) | | A* | B* |
|---|---|---|---|---|
| | Ion Doping by Ion Accelerator | Ion Doped Elements | | |
| La<br>\|<br>Sr<br>\|<br>Cu<br>\|<br>O | Accelerating Voltage<br>120<br>\|<br>keV<br>\|<br>3<br>MeV | Ti<br>V<br>Cr<br>Mn<br>Fe<br>Co<br>Ni | Yes<br>"<br>"<br>"<br>"<br>"<br>" | No<br>"<br>"<br>"<br>"<br>"<br>" |
| | Amount Doped<br>0.1<br>\|<br>10% | Zn<br>V & O<br>Si & O<br>Si & N<br>Mg & O | "<br>"<br>"<br>"<br>" | "<br>Yes<br>"<br>"<br>" |
| Y<br>\|<br>Ba<br>\|<br>Cu<br>\|<br>O | | Al & O<br>V & O<br>Si & O<br>Si & N<br>Mg & O<br>Al & O | "<br>"<br>"<br>"<br>"<br>" | "<br>"<br>"<br>"<br>"<br>" |
| | Application of Laser Light (Quenching after Melting) | | " | No |
| | Application of Electron Beam (Quenching after Melting) | | " | " |

A*: whether or not there was the conversion to the superconductive
B*: whether or not there was the conversion to the insulative

What is claimed is:

1. A process for manufacturing a device having a pattern of a superconductor, which comprises applying an oxygen ion beam to a predetermined region of a non-superconductive oxide having a desired shape while heating said non-superconductive oxide to an elevated temperature and for a period of time sufficient to recover crystal lattices which exhibit superconductivity of said non-superconductive oxide to control, said oxygen content to approximately the stoichiometric amount of said oxide during application of said oxygen ion beam only in said predetermined region, an amount of oxygen ions applied being sufficient to convert the non-superconductive oxide in said predetermined region to the pattern of superconductive oxide to obtain the device, said superconductive oxide being selected from the group consisting of a perovskite oxide having a structure of $A^1_{1-x}A'_xB^1O_3$, wherein $A^1$ is Ba, Pb, La, Pr or Nd, A' is Ca, Ba, Sr or Pb, and $B^1$ is Cu, Mg, Mn, Fe, Co or Ni; a layer perovskite oxide having a structure of $A^2{}_2B^2O_4$, wherein $A^2$ is a rare earth metal and $B^2$ is a transition metal, or a structure of $A^3{}_{2(1-x)}A''_{2x}B^3O_4$, wherein $A^3$ and $A''$ are elements of group IIIB and Group IIA of the Periodic Table, and $B^3$ is a transition metal; an oxygen-deficient perovskite layer oxide having a structure of $A^4B^4{}_2C^1{}_3O_7$, wherein $A^4$ is Y or a lanthanoid of La, Nd, Dy, Sm, Eu, Gd, Ho, Er, Tm or Yb, $B^4$ is Ba, Sr, Ca or Sc, and $C^1$ is Cu; a multilayer perovskite oxide having a structure of $A^5{}_2(B^5,C^2)_3D_2O_8$, wherein $A^5$ is Bi or Tl, $B^5$ is Ba or Sr, $C^2$ is Ca, and D is Cu; and a spinel oxide having a structure of $A^6B^6{}_2O_4$, wherein $A^6$ is Li and $B^6$ is Ti; and said non-superconductive oxide having a composition which can be converted so that of said superconductive oxide by the application of said oxygen ion beam.

2. A process according to claim 1, wherein said perovskite oxide is $(La_{1-x}Sr_x)CoO_3$ or $(La_{1-x}Sr_x)CrO_3$.

3. A process according to claim 1, wherein said layer perovskite oxide is $La_2CuO_4$, $La_2NiO_4$, $(La_{1-x}Sr_x)_2CuO_4$, $(La_{1-x}Ba_x)_2CuO_4$, $(Y_{1-x}Ba_x)_2CuO_4$, $(Y_{1-x}Sr_x)_2CuO_4$ or $(Sc_{1-x}Sr_x)_2CuO_4$.

4. A process according to claim 1, wherein said oxygen-deficient perovskite layer oxide is $YBa_2Cu_{3-x}Ni_xO_7$ or $LnBa_2Cu_3O_7$, wherein Ln is the same lanthanoid as defined for $A^4$, $YSr_2Cu_3O_7$, $YBa_2Cu_{3-x}Ni_xO_7$, $YBa_2Cu_{3-x}Ag_xO_7$, $YBaCaCu_3O_7$, $Y_{0.75}Sc_{0.25}Ba_2Cu_3O_7$ or $YBa_2Cu_3F_2O_5$.

5. A process according to claim 1, wherein said multilayer perovskite oxide is $Bi_4Sr_3Ca_3Cu_4O_{16}$ or $Tl_4Ba_2Ca_2Cu_4O_{16}$.

6. A process according to claim 1, wherein said spinel oxide is $LiTi_2O_4$.

7. A process according to claim 1, further comprising heat treating said superconductive oxide to a temperature capable of recovering crystal lattices of said superconductive oxide after application of said oxygen beam.

8. A process according to claim 1, wherein said device is any of a superconductive magnet, superconductive power transmission wire, superconductive transformer, superconductive shield, permanent current switch and electronic element.

9. A process according to claim 8, wherein said element includes superconductive circuits or wirings.

10. A process according to claim 1, further comprising heat treating said superconductive oxide to a temperature capable of recovering crystal lattices of said superconductive oxide after application of said oxygen ion beam.

11. A process according to claim 1, wherein said predetermined region of non-superconductive oxide is provided on an electrically insulative substrate.

12. A process for manufacturing a device having a pattern of a superconductor, which comprises applying an energy beam selected from an electron beam, a neutron beam, a laser beam and an infrared ray beam to a predetermined region of a non-superconductive oxide having a desired shape while heating said non-superconductive oxide to an elevated temperature and for a period of time sufficient to recover crystal lattices which exhibit superconductivity of said non-superconductive oxide in an atmosphere containing oxygen gas to control said oxygen content to approximately the stoichiometric amount of said oxide during application of said energy beam only in said predetermined region, said energy beam having an energy sufficient to convert the non-superconductive oxide in said predetermined region to the pattern of superconductive oxide to obtain the device, said superconductive oxide being selected from the group consisting of a perovskite oxide having a structure of $A^1{}_{1-x}A'_xB^1O_3$, wherein $A^1$ is Ba, Pb, La, Pr or Nd, $A'$ is Ca, Ba, Sr or Pb, and $B^1$ is Cu, Mg, Mn, Fe, Co or Ni; a layer perovskite oxide having a structure of $A^2{}_2B^2O_4$, wherein $A^2$ is a rare earth metal and $B^2$ is a transition metal, or a structure of $A^3{}_{2(1-x)}A''_{2x}B^3O_4$, wherein $A^3$ and $A''$ are elements of Group IIIB and Group IIA of the Periodic Table, and $B^3$ is a transition metal; and oxygen-deficient perovskite layer oxide having a structure of $A^4B^4{}_2C^1{}_3O_7$, wherein $A^4$ is Y or a lanthanoid of La, Nd, Dy, Sm, Eu, Gd, Ho, Er, Tm or Yb, $B^4$ is Ba, Sr, Ca or Sc, and $C^1$ is Cu; a multilayer perovskite oxide having a structure of $A^5{}_2(B^5,C^2)_3D_2O_8$, wherein $A^5$ is Bi or Tl, $B^5$ is Ba or Sr, $C^2$ is Ca, and D is Cu; and a spinel oxide having a structure of $A^6B^6{}_2O_4$, wherein $A^6$ is Li and $B^6$ is Ti; and said non-superconductive oxide having a composition which can be converted to that of said superconductive oxide by the application of said energy beam.

13. A process according to claim 12, wherein said perovskite oxide is $(La_{1-x}Sr_x)CoO_3$, $(La_{1-x}Sr_x)CrO_3$ or $(La_{1-x}Sr_x)CrO_3$.

14. A process according to claim 12, wherein said layer perovskite oxide is $La_2CuO_4$, $La_{1-x}NiO_4$, $(La_{1-x}Sr_x)_2CuO_4$, $(La_{1-x}Ba_x)_2CuO_4$, $(Y_{1-x}Ba_x)_2CuO_4$, $(Y_{1-x}Sr_x)_2CuO_4$ or $(Sc_{1-x}Sr_x)_2CuO_4$.

15. A process according to claim 12, wherein said oxygen-deficient perovskite layer oxide is $YBa_2Cu_{3-x}Ni_xO_7$ or $LnBa_2Cu_3O_7$, wherein Ln is the same lanthanoid as defined for $A^4$, $YSr_2Cu_3O_7$, $YBa_2Cu_{3-x}Ni_xO_7$, $YBa_2Cu_{3-x}Ag_xO_{7-x}$, $YBaCaCu_3O$, $Y_{0.75}Sc_{0.25}Ba_2Cu_3O_7$ or $YBa_2Cu_3F_2O_5$.

16. A process according to claim 12, wherein said multilayer perovskite oxide is $Bi_4Sr_3Ca_3Cu_4O_{16}$ or $Tl_4Ba_2Ca_2Cu_4O_{16}$.

17. A process according to claim 12, wherein said spinel oxide is $LiTi_2O_4$.

18. A process according to claim 12, further comprising heat treating said superconductive oxide to a temperature capable of recovering crystal lattices of said superconductive oxide after application of said energy beam.

19. A process according to claim 12, wherein said heating is accomplished by heat produced by said energy beam.

20. A process according to claim 12, wherein said heating is accomplished by applying additional heat other than said energy beam.

21. A process according to claim 12, wherein said device is any of a superconductive magnet, superconductive power transmission wire, superconductive transformer, superconductive shield, permanent current switch and electronic element.

22. A process according to claim 21, wherein said element includes superconductive circuits or wirings.

23. A process according to claim 12, further comprising heat treating said superconductive oxide to a temperature capable of recovering crystal lattices of said superconductive oxide after application of said energy beam.

24. A process according to claim 12, wherein said heating is accomplished by heat produced by said energy beam.

25. A process according to claim 12, wherein said heating is accomplished by applying additional heat other than said energy beam.

26. A process according to claim 12, wherein said predetermined region of non-superconductive oxide is provided on an electrically insulative substrate.

27. A process for manufacturing a device having a pattern of superconductor, which comprises applying a beam of ions having an energy that is necessary for displacement of oxygen to reduce the oxygen content of shaped superconductive oxide at sites of oxygen in a crystal lattice of said oxide at selected regions of said superconductive oxide, said ions being one selected from the group consisting of titanium, vanadium, chromium, manganese, iron, cobalt, nickel, zinc, silicon, nitrogen, aluminum, magnesium, vanadium+oxygen, silicon+oxygen, silicon+nitrogen, magnesium+oxygen, and aluminum+oxygen, or applying a beam of hydrogen ions to reduce the oxygen content of said oxide at selected regions of said superconductive oxide, thereby converting the superconductive oxide to the non-superconductive oxide only at said selected regions, said selected regions being outside said pattern of superconductor, to obtain the deice, said superconductive oxide being selected from the group consisting of a perovskite oxide having a structure of $A^1_{1-x}A'_xB^1O_3$, wherein $A^1$ is Ba, Pb, La, Pr or Nd, A' is Ca, Ba, Sr or Pb, and $B^1$ is Cu, Mg, Mn, Fe, Co or Ni; a layer perovskite oxide having a structure of $A^2_2B^2O_4$, wherein $A^2$ is a rare earth metal and $B^2$ is a transitional metal, or a structure of $A^3_{2(1-x)}A''_{2x}B^3O_4$, wherein $A^3$ and $A''$ are elements of Group IIIB and Group IIA of the Periodic Table, and $B^3$ is a transition metal; and oxygen-deficient perovskite layer oxide having a structure of $A^4B^4_2C^1_3O_7$, wherein $A^4$ is Y or a lanthanoid of La, Nd, Dy, Sm, Eu, Gd, Ho, Er, Tm or Yb, $B^4$ is Ba, Sr, Ca or Sc, and $C^1$ is Cu; a multilayer perovskite oxide having a structure of $A^5_2(B^5,C^2)_3D_2O_8$, wherein $A^5$ is Bi or Tl, $B^5$ is Ba or Sr, $C^2$ is Ca, and D is Cu; and a spinel oxide having a structure of $A^6B^6_2O_4$, wherein $A^6$ is Li and $B^6$ is Ti.

28. A process according to claim 27, wherein said perovskite oxide is $(La_{1-x}Sr_x)CoO_3$, $(La_{1-x}Sr_x)CrO_3$ or $(La_{1-x}Sr_x)CrO_{3-\delta}$.

29. A process according to claim 27, wherein said layer perovskite oxide is $La_2CuO_4$, $La_2NiO_4$, $(La_{1-x}Sr_x)_2CuO_4$, $(La_{1-x}Ba_x)_2CuO_4$, $(Y_{1-x}Ba_x)_2CuO_4$, $(Y_{1-x}Sr_x)_2CuO_4$ or $(Sc_{1-x}Sr_x)_2CuO_4$.

30. A process according to claim 27, wherein said oxygen-deficient perovskite layer oxide is $YBa_2Cu_{3-x}Ni_xO_7$ or $LnBa_2Cu_3O_7$, wherein Ln is the same lanthanoid as defined for $A^4$, $YSr_2Cu_3O_7$, $YBa_2Cu_{3-x}Ni_xO_7$, $YBa_2Cu_{3-x}Ag_xO_7$, $YBaCaCu_3O_7$, $Y_{0.75}Sc_{0.25}Ba_2Cu_3O_7$ or $YBa_2Cu_3F_2O_5$.

31. A process according to claim 27, wherein said multilayer perovskite oxide is $Bi_4Sr_3Ca_3Cu_4O_{16}$ or $Tl_4Ba_2Ca_2Cu_4O_6$.

32. A process according to claim 27, wherein said spinel oxide is $LiTi_2O_4$.

33. A process according to claim 27, wherein said device is any of a superconductive magnet, superconductive power transmission wire, superconductive transformer, superconductive shield, permanent current switch and electronic element.

34. A process according to claim 33, wherein said element includes superconductive circuits or wirings.

35. A process according to claim 27, wherein said selected regions of said superconductive oxide are provided on an electrically insulative substrate.

36. A process for manufacturing a superconductive oxide having a high critical current density in a magnetic field, which comprises applying a particle beam to the superconductive oxide in an amount sufficient to increase a critical current density of the superconductive oxide by forming radiation defects therein.

37. A process according to claim 36, wherein said superconductive oxide is provided on an electrically insulative substrate.

38. A process for manufacturing a superconductive device from a non-superconductive oxide formed in a desired shape of the device, which comprises applying an oxygen ion beam to a predetermined region of said non-superconductive oxide while heating said non-superconductive oxide to an elevated temperature and for a period of time sufficient to recover crystal lattices which exhibit superconductivity of said non-superconductive oxide to control said oxygen content to approximately the stoichiometric amount of said oxide only in said predetermined region, an amount of oxygen ions applied being sufficient to convert the non-superconductive oxide to the superconductive oxide in said predetermined region to obtain the device; said non-superconductive oxide having a composition which can be converted to that of said superconductive oxide by the application of said oxygen ion beam.

39. A process according to claim 38, wherein said non-superconductive oxide is provided on an electrically insulative substrate.

40. A process for manufacturing a device having a pattern of a superconductor, which comprises applying an energy beam selected from an electron beam, a neutron beam, a laser beam and an infrared ray beam to a predetermined region of a non-superconductive oxide having a desired shape while heating said non-superconductive oxide to an elevated temperature and for a period of time sufficient to recover crystal lattices which exhibit superconductivity of said non-superconductive oxide in an atmosphere containing oxygen gas to control said oxygen content to approximately the stoichiometric amount of said oxide only in said predetermined region, said energy beam having an energy sufficient to convert the non-superconductive oxide in said predetermined region to the superconductive oxide to obtain the device, said non-superconductive oxide having a composition which can be converted to that of said superconductive oxide by the application of said energy beam.

41. A process according to claim 40, wherein said non-superconductive oxide having a desired shape is provided on an electrically insulative substrate.

42. A process for manufacturing a device having a pattern of superconductor, which comprises applying a beam of ions having an energy that is necessary for displacement of oxygen to reduce the oxygen content of shaped superconductive oxide at sites of oxygen in a crystal lattice of said oxide at selected regions of said superconductive oxide, said ions being one selected from the group consisting of titanium, vanadium, chromium, manganese, iron, cobalt, nickel, zinc, silicon, nitrogen, aluminum, magnesium, vanadium+oxygen, silicon+oxygen, silicon+nitrogen, magnesium+oxygen, and aluminum+oxygen, or applying a beam of hydrogen ions to reduce the oxygen content of said oxide at selected regions of said superconductive oxide, thereby converting the superconductive oxide to the non-superconductive oxide only at said selected regions, said selected regions being outside said pattern of superconductor, to obtain the device.

43. A process according to claim 42, wherein said selected regions of said superconductive oxide are provided on an electrically insulative substrate.

* * * * *

Adverse Decision In Interference

Patent No. 5,096,882, Takahiko Kato, Katsuzo Aihara, Jiro Kuniya, Yutaka Misawa, Yoshihide Wadayama, Masahiro Ogihara, Toshikazu Nishino, Ushio Kawabe, Haruhiro Hasegawa, Kazumasa Takagi, Tokuumi Fukazawa, Katsuki Miyauchi, PROCESS FOR CONTROLLING OXYGEN CONTENT OF SUPERCONDUCTIVE OXIDE, SUPERCONDUCTIVE DEVICE AND PROCESS FOR PRODUCTION THEREOF, Interference No. 103,707, final judgment adverse to the patentees rendered March 7, 2002, as to claims 27-37, 42 and 43.

*(Official Gazette November 26, 2002)*